United States Patent
Lee et al.

(10) Patent No.: US 9,275,982 B2
(45) Date of Patent: Mar. 1, 2016

(54) METHOD OF FORMING INTERCONNECTION STRUCTURE OF PACKAGE STRUCTURE

(71) Applicant: Delta Electronics, Inc., Taoyuan (TW)

(72) Inventors: Chia-Yen Lee, Taoyuan (TW);
Hsin-Chang Tsai, Taoyuan (TW);
Peng-Hsin Lee, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 14/591,551

(22) Filed: Jan. 7, 2015

(65) Prior Publication Data
US 2015/0125995 A1     May 7, 2015

Related U.S. Application Data

(60) Division of application No. 14/020,045, filed on Sep. 6, 2013, now Pat. No. 9,209,164, which is a continuation-in-part of application No. 13/675,297, filed on Nov. 13, 2012, now Pat. No. 9,159,699.

(51) Int. Cl.
*H01L 23/12*   (2006.01)
*H01L 23/48*   (2006.01)
(Continued)

(52) U.S. Cl.
CPC .............. *H01L 25/50* (2013.01); *H01L 21/768* (2013.01); *H01L 21/76877* (2013.01); *H01L 21/76898* (2013.01); *H01L 23/481* (2013.01); *H01L 25/0657* (2013.01); *H01L 25/074* (2013.01); *H01L 25/18* (2013.01); *H01L 24/03* (2013.01); *H01L 24/05* (2013.01); *H01L 24/13* (2013.01); *H01L 24/16* (2013.01); *H01L 24/81* (2013.01);
(Continued)

(58) Field of Classification Search
CPC ............ H01L 2924/1306; H01L 24/11; H01L 23/481; H01L 21/563; H01L 2225/1035; H01L 24/19; H01L 2224/48091; H01L 21/768; H01L 2924/13091
USPC ........... 257/528, 531, 532, 774; 438/121, 612
See application file for complete search history.

(56) References Cited

U.S. PATENT DOCUMENTS

| 6,620,731 B1 | 9/2003 | Farnworth |
| 7,312,400 B2 | 12/2007 | Ito et al. |

(Continued)

FOREIGN PATENT DOCUMENTS

| JP | 2004-128177 A | 4/2004 |
| WO | WO 2012/090901 A1 | 7/2012 |

*Primary Examiner* — Evan Pert
*Assistant Examiner* — Changhyun Yi
(74) *Attorney, Agent, or Firm* — Muncy, Geissler, Olds & Lowe, P.C.

(57) ABSTRACT

A package structure including: a first semiconductor device including a first semiconductor substrate and a first electronic device, the first semiconductor device having a first side and a second side, wherein at least part of the first electronic device being adjacent to the first side, and the first semiconductor device has a via-hole formed through the first semiconductor device, wherein the via-hole has a first opening adjacent to the first side; an interconnection structure disposed in the first semiconductor device, wherein the interconnection structure includes: a via structure disposed in the via-hole without exceeding the first opening; a first pad disposed on the first side of the first semiconductor device and covering the via-hole; and a second semiconductor device vertically integrated with the first semiconductor device.

10 Claims, 20 Drawing Sheets

(51) Int. Cl.
  *H01L 25/00* (2006.01)
  *H01L 21/768* (2006.01)
  *H01L 25/07* (2006.01)
  *H01L 25/18* (2006.01)
  *H01L 25/065* (2006.01)
  *H01L 23/00* (2006.01)

(52) U.S. Cl.
  CPC ........... *H01L 2224/02372* (2013.01); *H01L 2224/0332* (2013.01); *H01L 2224/0401* (2013.01); *H01L 2224/05009* (2013.01); *H01L 2224/0557* (2013.01); *H01L 2224/05147* (2013.01); *H01L 2224/05548* (2013.01); *H01L 2224/06181* (2013.01); *H01L 2224/131* (2013.01); *H01L 2224/13024* (2013.01); *H01L 2224/13147* (2013.01); *H01L 2224/16146* (2013.01); *H01L 2224/16148* (2013.01); *H01L 2224/81193* (2013.01); *H01L 2224/81815* (2013.01); *H01L 2924/00014* (2013.01); *H01L 2924/12042* (2013.01)

(56) References Cited

U.S. PATENT DOCUMENTS

| | | | |
|---|---|---|---|
| 7,528,475 | B2 | 5/2009 | Go et al. |
| 7,772,116 | B2 | 8/2010 | Akram et al. |
| 7,843,072 | B1 | 11/2010 | Park et al. |
| 8,575,760 | B2 | 11/2013 | Phee et al. |
| 2003/0080408 | A1* | 5/2003 | Farnworth et al. ............ 257/698 |
| 2004/0080023 | A1 | 4/2004 | Ueda |
| 2006/0186441 | A1 | 8/2006 | Takayama et al. |
| 2006/0226415 | A1 | 10/2006 | Nishijima et al. |
| 2007/0027699 | A1 | 2/2007 | Golding et al. |
| 2007/0194436 | A1 | 8/2007 | Kao et al. |
| 2010/0218818 | A1 | 9/2010 | Kang et al. |
| 2011/0101399 | A1 | 5/2011 | Suehiro et al. |
| 2011/0174533 | A1 | 7/2011 | Nagano |
| 2011/0175142 | A1 | 7/2011 | Tsurumi et al. |
| 2013/0272648 | A1 | 10/2013 | Terada et al. |
| 2014/0048906 | A1 | 2/2014 | Shim et al. |
| 2014/0206147 | A1 | 7/2014 | Oganesian et al. |
| 2014/0252562 | A1 | 9/2014 | Kirby et al. |
| 2014/0327150 | A1 | 11/2014 | Jung et al. |

* cited by examiner

METHOD OF FORMING INTERCONNECTION STRUCTURE OF PACKAGE STRUCTURE

CROSS REFERENCE TO RELATED APPLICATIONS

This application is a Division of pending U.S. patent application Ser. No. 14/020,045, filed Sep. 6, 2013 and entitled "package structure and method of forming the same", which is a Continuation-In-Part of pending U.S. patent application Ser. No. 13/675,297, filed Nov. 13, 2012 and entitled "interconnection structure and fabrication thereof."

BACKGROUND OF THE INVENTION

1. Field of the Invention

This invention relates generally to semiconductor devices, and specifically, to package structures and methods for fabricating the same.

2. Description of the Related Art

Semiconductor components include external contacts that allow electrical connections to be made from the outside to the integrated circuits contained in the semiconductor components. A semiconductor die, for example, includes patterns of bond pads formed on the face of the die. Semiconductor packages, such as chip scale packages, also include external contacts. Typically, a component includes only one set of external contacts on either the face side (circuit side) or the back side of the component. However, it is sometimes necessary for a component to have external contacts on both sides.

In semiconductor technology, a through-silicon via, also known as a through-substrate via, is a conductive feature formed in a semiconductor substrate (wafer or die) to electrically connect external contacts from both sides. The TSV feature vertically passes through the semiconductor substrate, providing for stacked wafer/die packaging methods and allowing for electrical connection between circuits within separate wafers or chips. There are a number of ways to create a TSV. Typically, a hole is etched into the semiconductor substrate, and sometimes through the interconnect structure as well. The hole may then be lined with various isolating layers and/or various metal layers. The hole is then filled with a conductive material, typically copper (Cu), which becomes the major part of a TSV.

In traditional technologies, an electrode electroplating method is used for the conductive filling materials to be disposed in the hole of the through silicon via (TSV), wherein a seeding layer is formed by a vacuum technique, such as plasma vapor deposition, prior to formation of the conductive filling material. The vacuum technique requires high-priced equipment, which increases device costs.

BRIEF SUMMARY OF INVENTION

The invention provides a package structure including: a first semiconductor device including a first semiconductor substrate and a first electronic device, the first semiconductor device having a first side and a second side opposite to the first side, wherein at least part of the first electronic device being adjacent to the first side, and wherein the first semiconductor device has a via-hole formed through the first semiconductor device, wherein the via-hole has a first opening adjacent to the first side; an interconnection structure disposed in the first semiconductor device, wherein the interconnection structure comprises: a via structure disposed in the via-hole without exceeding the first opening; a first pad disposed on the first side of the first semiconductor device and covering the via-hole, wherein the first pad is adjoined to the via structure and is electrically connected to the first electronic device; and a second semiconductor device vertically integrated with the first semiconductor device, wherein the second semiconductor device comprises a second electronic device electrically connected with the first electronic device.

The invention provides a method of forming a package structure including: providing a first semiconductor device having a first side and a second side opposite to the first side; forming a via-hole through the first semiconductor device, wherein the via-hole has a first opening neighboring the first side and a second opening neighboring the second side; forming a first pad covering the first opening; forming a via structure in the via-hole subsequent to forming the first pad, wherein the via structure comprises a conductive material and is adjoined to the first pad; and substantially vertically integrating the first semiconductor device with a second semiconductor device

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
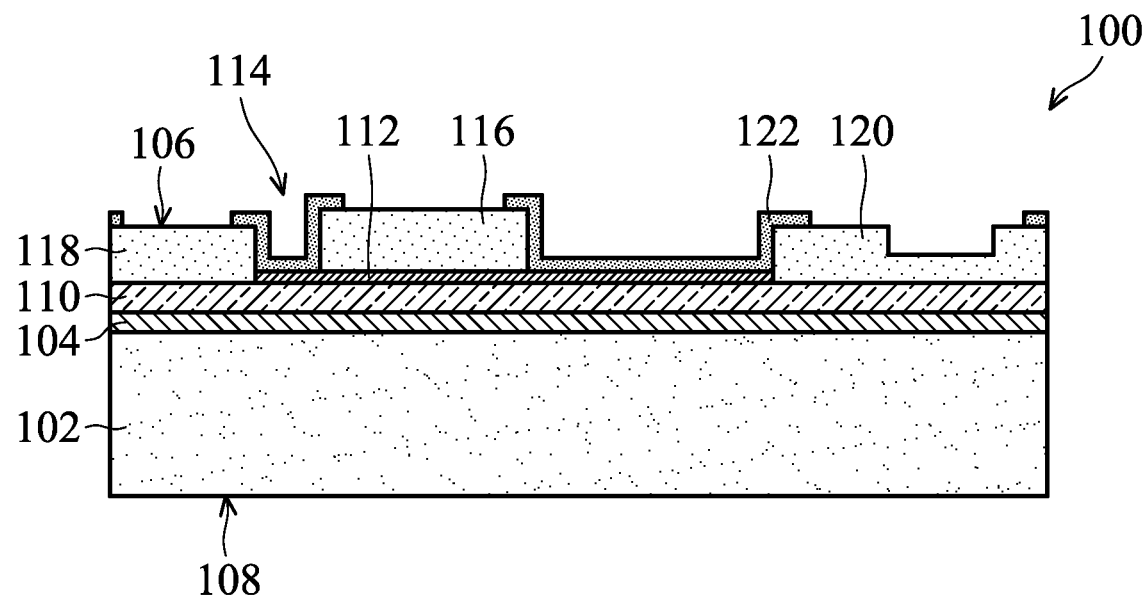
FIG. 1A to FIG. 1F show intermediate stages of cross sections of a method for forming a first semiconductor device with an interconnect structure of an embodiment of the invention.

It is understood that specific embodiments are provided as examples to teach the broader inventive concept, and one of ordinary skill in the art can easily apply the teaching of the present disclosure to other methods or apparatuses. The following discussion is only used to illustrate the invention, not limit the invention.

A method for forming a first semiconductor device 100 with an interconnection structure of an embodiment of the invention is illustrated in accordance with FIG. 1A to FIG. 1F. First, referring to FIG. 1A, a first semiconductor device 100 is provided. The first semiconductor device 100 includes a first side 106 and a second side 108 opposite to the first side 106. The first semiconductor device 100 includes a substrate 102. The substrate 102 can be any suitable semiconductor material. For example, the substrate 102 can be Si, SiC, Ge, SiGe, GaAs, InAs, InP or GaN. Next, a buffer layer 104 is formed on the substrate 102. In an embodiment of the invention, the buffer layer 104 can be a nitride based material to provide good adhesion for the layers thereon and also solve issues of lattice mismatch, but the invention is not limited thereto. The buffer layer 104 can be formed of any suitable material. In an embodiment of the invention, the buffer layer 104 can be aluminum nitride. A channel layer 110 and a barrier layer 112 are formed on the buffer layer 104. In an embodiment, the channel layer 110 can be GaN and the barrier layer 112 can be AlGaN. Thereafter, a first metal layer (not shown) is formed on the channel layer 110 and is then patterned by lithography and etching to form a source electrode 118 and a drain electrode 120. In an embodiment of the invention, the first metal layer is a stack of Ti, Al, Ni and/or Au layers. Furthermore, a rapid thermal annealing (RTA) process can be performed to the first metal layer. A second metal layer (not shown) is deposited on the channel layer 110 and then patterned by lithography and etching to form a gate electrode 116. Next, a passivation layer 122, such as a silicon nitride or silicon oxide layer, is formed to protect the device thereunder. The channel layer 110, the barrier layer 112, the gate electrode 116, the source electrode 118, and the drain electrode 120 constitute an electronic device 114 adjacent to the first side 106 of the first semiconductor device 100. In the embodiment, the electronic device 114 is disposed at the first side 106 of the first semiconductor device 100, but the invention is not limited thereto. The electronic device 114 can be disposed at the second side 108 of the first semiconductor device 100. Furthermore, in the embodiment, the electronic device 114 is a nitride-based semiconductor device. However, the invention is not limited to a nitride-based semiconductor device. The invention can be applied to any semiconductor device, such as a silicon based device, III-V group device and/or SOI device.

Figure 1B:
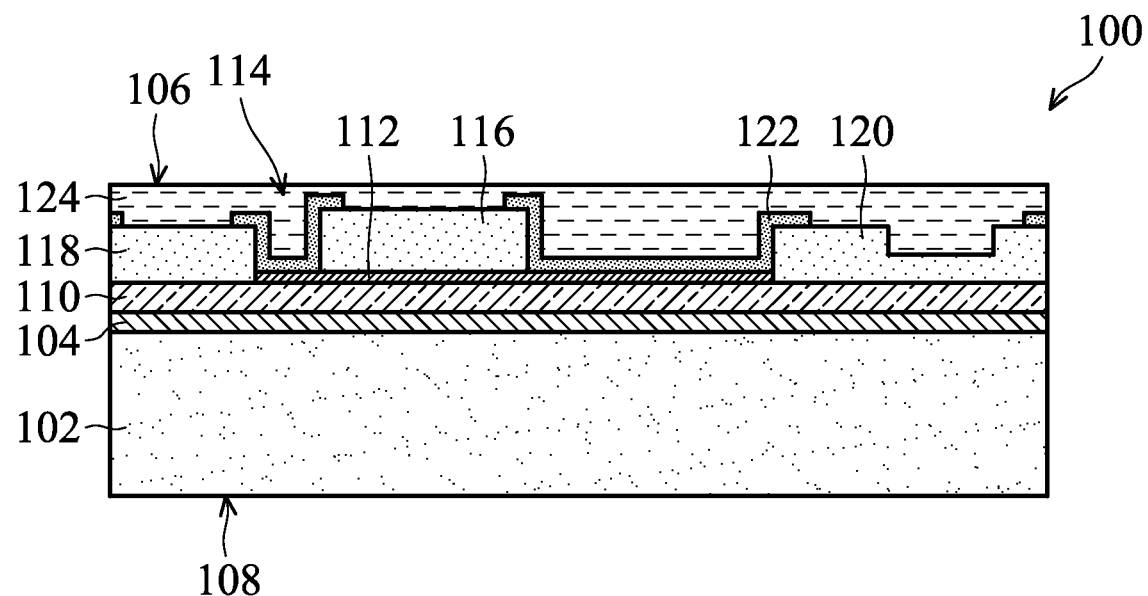
Figure 1C:
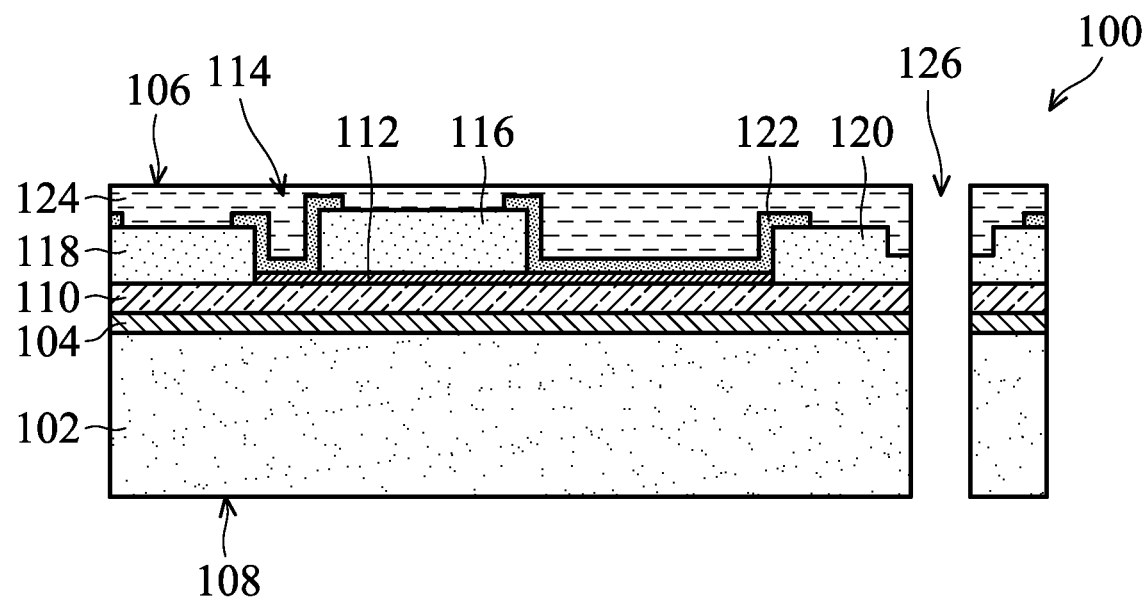

Next, referring to FIG. 1B, a photosensitive layer 124 is formed over the substrate 102 and the electronic device 114. Thereafter, referring to FIG. 1C, the photosensitive layer 124 is patterned by a lithography process and the substrate 102 is further etched using the patterned photosensitive layer 124 as a mask to form a via-hole 126 extending through the substrate 102. In an embodiment, the via-hole 126 can be formed with drilling using a laser beam.

Figure 1D:
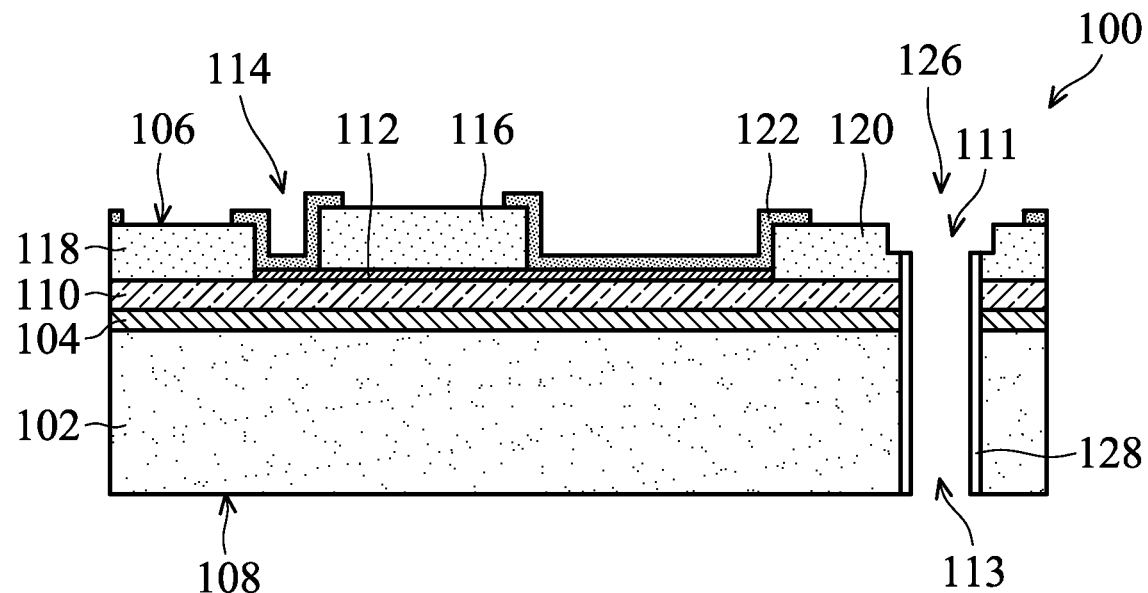

Referring to FIG. 1D, the photoresist layer 124 is then removed. In an embodiment, an insulating layer 128 is optionally formed on the sidewall of the via-hole 126 for protection. In an embodiment, the insulating layer 128 is silicon oxide and can be formed by thermal oxidation or liquid phase deposition (LPD). The via-hole 126 has a first opening 111 neighboring the first side 106 and a second opening 113 neighboring the second side 108.

Figure 1E:
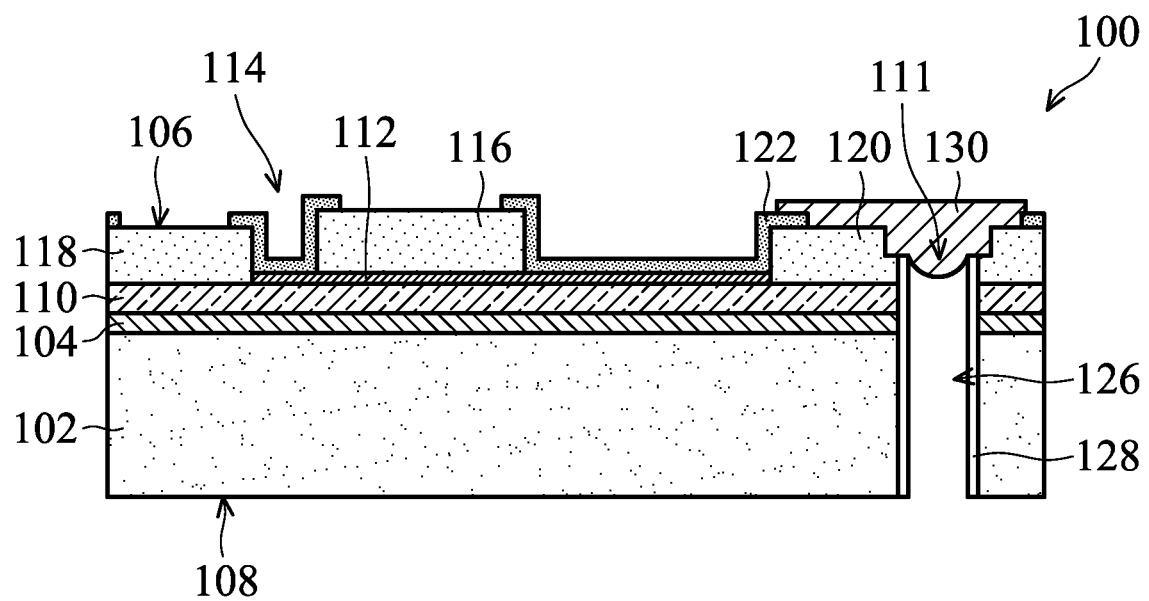
Figure 1F:
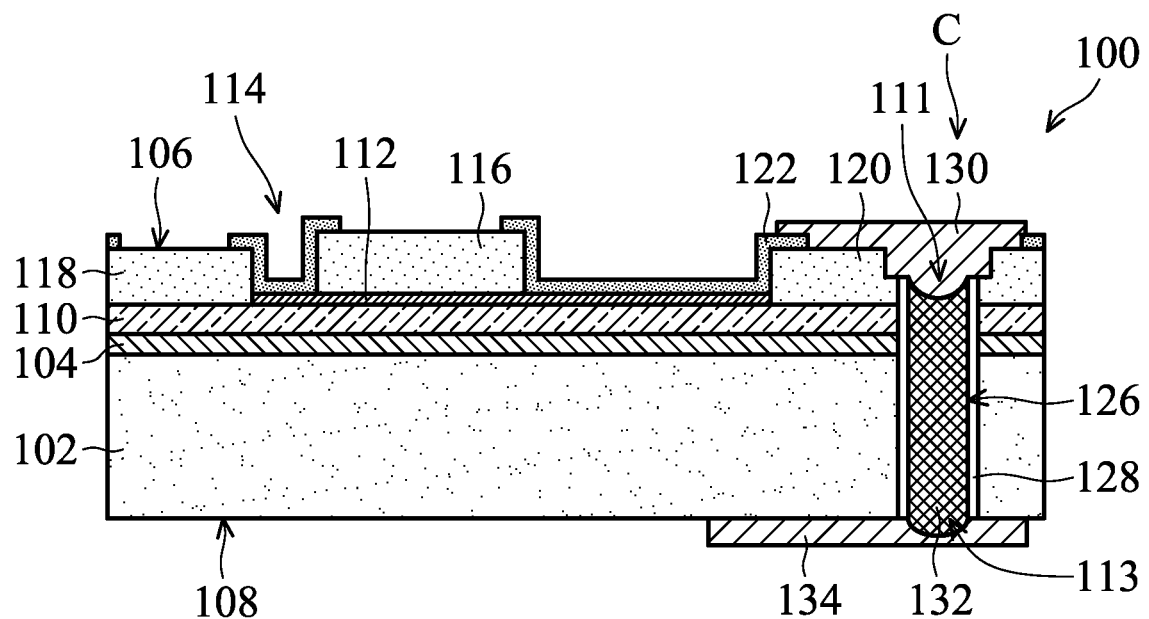

Referring to FIGS. 1E~1F, a first pad 130 is formed on the first side 106 of the first semiconductor device 100 and covers the first opening 111 of the via-hole 126. The first pad 130 can electrically connect to the electrical device 114 and a second pad 134 formed in subsequent steps, and can comprise a protrusion portion extending into the via-hole 126. In an embodiment, the first pad 130 can comprise silver paste and can be formed by screen printing. Referring to FIG. 1F, an electroplating process is performed using the first pad 130 as a seed layer to deposit a via structure 132 which fills the via-hole 126. In an embodiment, the via structure 132 and the first pad 130 comprises the same material. In another embodiment, the via structure 132 and the first pad 130 comprises different materials. For example, the via structure 132 can comprise copper. As shown in FIG. 1F, since the via structure 132 is formed sequentially after forming the first pad 130, the via structure 132 does not exceed the first opening 111 of the via-hole 126 neighboring the first side 106 of the first semiconductor device, but can exceed the second opening 113 of the via-hole 126 neighboring the second side 108 of the first semiconductor device. Next, a second pad 134 is formed on the second side 108 of the first semiconductor device 100. In an embodiment, the second pad 134 can comprise silver paste and can be formed by screen printing.

In FIG. 1F, the first semiconductor device 100 includes the semiconductor substrate 102 and an electronic device 114. The first semiconductor device 100 has the first side 106 and the second side 108 opposite to the first side 106. At least part of the electronic device 114 is adjacent to the first side 106. The first semiconductor device 100 has the via-hole 126 formed through the first semiconductor device 100, wherein the via-hole 126 has the first opening 111 adjacent to the first side 106.

An interconnection structure C is disposed in the first semiconductor device 100, wherein the interconnection structure C includes the via structure 132 and the first pad 130. The via structure 132 is disposed in the via-hole 126 without exceeding the first opening 111. The first pad 130 is disposed on the first side 106 of the first semiconductor device 100 and covers the via-hole 126, wherein the first pad 130 is adjoined to the via structure 132 and is electrically connected to the electronic device 114.

In an embodiment of the invention, the electrical device 114 is a high electron mobility transistor (HEMT) and the substrate 102 comprises a semiconductor substrate. The source electrode 118 is electrically connected to the semiconductor substrate through the via structure 132.

Figure 2:
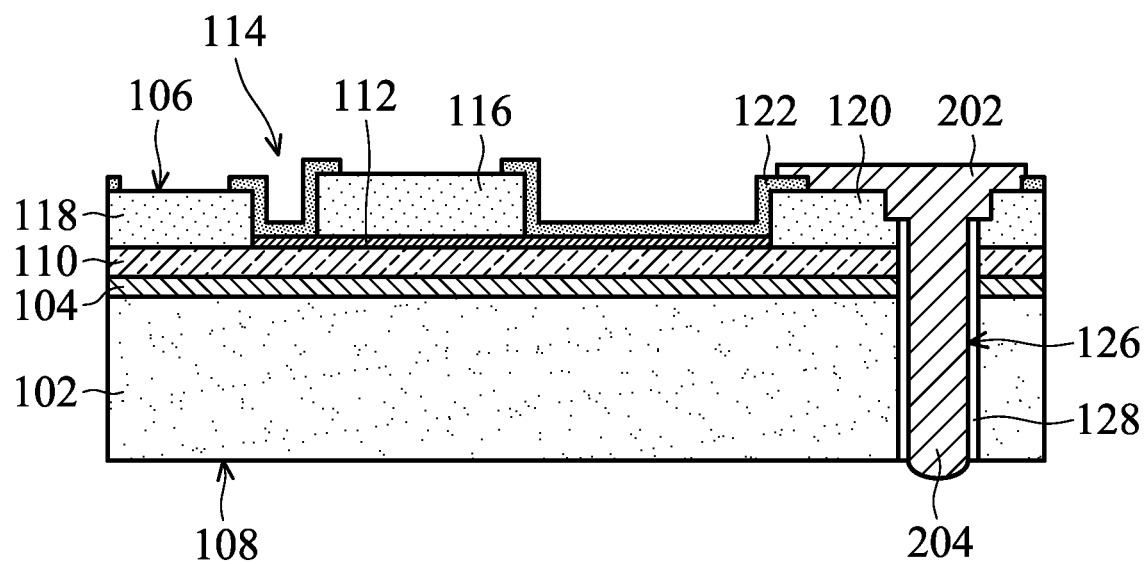
FIG. 2 show an intermediate stage of a cross section of a method for forming a first semiconductor device with an interconnect structure of an embodiment of the invention.

A method for forming a first semiconductor device of another embodiment of the invention is illustrated in accordance with FIG. 2. The embodiment of the method for forming the first semiconductor device of FIG. 2 is similar to the method of FIGS. 1E~1F and for simplicity its detailed descriptions of similar steps are omitted. The method for forming the first semiconductor device of FIG. 2 is different from the method for forming the first semiconductor device of FIGS. 1E~1F in that the first pad 202 and the via structure 204 are formed by a single step. In the embodiment, when the through hole 126 depth is not great, for example the depth of the through hole is 10 μm to 200 μm, as shown in FIG. 2, the screen print for forming the first pad 202 can also fill the through hole 126, so that formation of the first pad 202 and the via structure 204 can be performed by a single screen printing step.

A method for forming a first semiconductor device of yet another embodiment of the invention is illustrated in accordance with FIG. 3A to FIG. 3F. The method of the embodiment illustrated in FIG. 3A to FIG. 3F differs from the embodiment illustrated in FIG. 1A to FIG. 1F by the forming of the pad on the second side of the substrate opposite to the first side with the electronic device prior to forming the via structure. First, referring to FIG. 3A, a semiconductor device 300 is provided. The semiconductor device 300 has a first side 306 and a second side 308. The semiconductor device 300 has a substrate 302. The substrate 302 can be any suitable semiconductor material. For example, the substrate 302 can be Si, SiC, Ge, SiGe, GaAs, InAs, InP or GaN. Next, a buffer layer 304 is formed on the substrate 302. In an embodiment of the invention, the buffer layer 304 can be aluminum nitride. A channel layer 310 and a barrier layer 312 are formed on the buffer layer 304. In an embodiment, the channel layer 310 can be GaN and the barrier layer 312 can be AlGaN. Thereafter, a first metal layer (not shown) is formed on the channel layer 310 and is then patterned by lithography and etching to form a source electrode 318 and a drain electrode 320. In an embodiment of the invention, the first metal layer is a stack of Ti, Al, Ni or Au layers. Furthermore, a rapid thermal annealing (RTA) process can be performed to the first metal layer. A second metal layer (not shown) is deposited and then patterned by lithography and etching to form a gate electrode 316. A passivation layer 322, such as silicon nitride and silicon oxide, is formed to protect the semiconductor device thereunder. The channel layer 310, the barrier layer 312, the gate electrode 316, the source electrode 318, and the drain electrode 320 constitute an electronic device 314 which is adjacent to the first side 306 of the substrate 302. In the embodiment, the electronic device 314 is a nitride-based semiconductor device. However, the invention is not limited to being applied to a nitride-based semiconductor device. The invention can be applied to any semiconductor device, such as a silicon based device, III-V group device and/or SOI device.

Figure 3A:
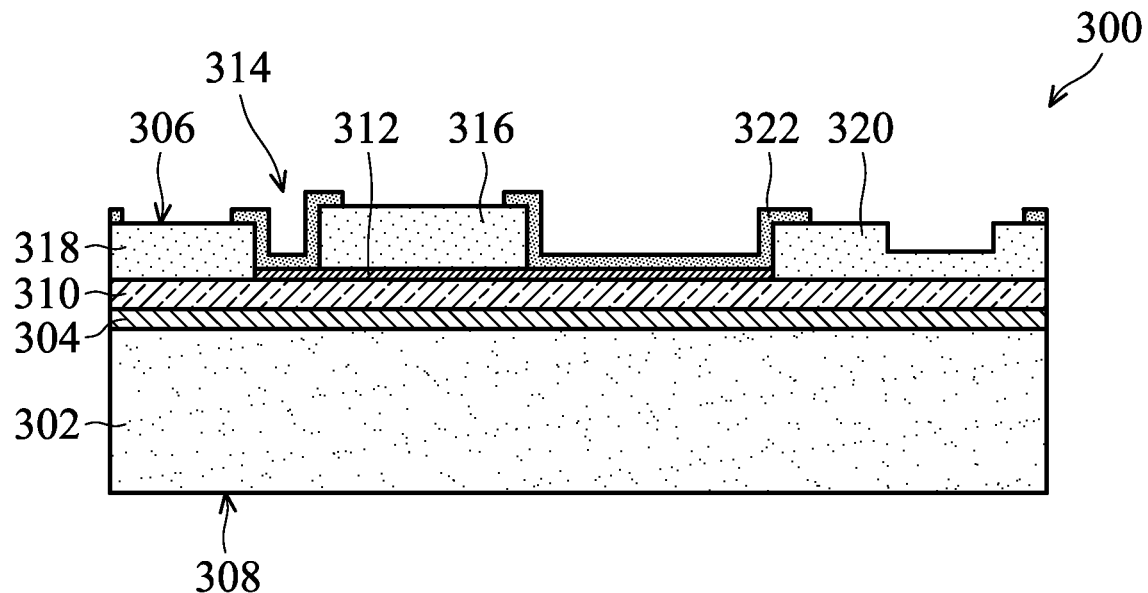
FIG. 3A to FIG. 3F show intermediate stages of cross sections of a method for forming a first semiconductor device with an interconnect structure of an embodiment of the invention.
Figure 3B:
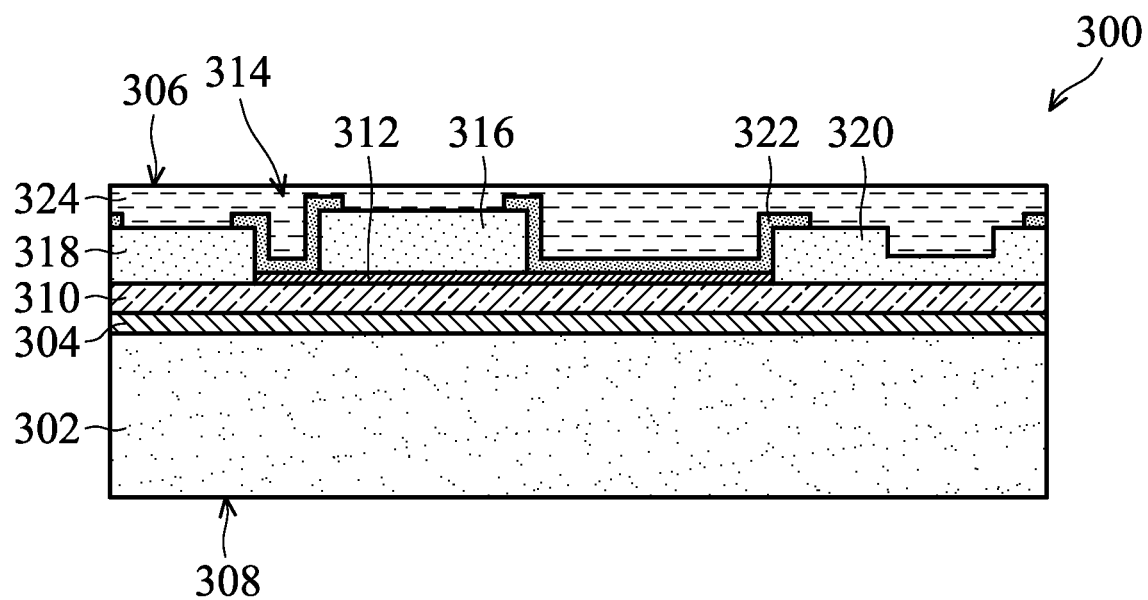
Figure 3C:
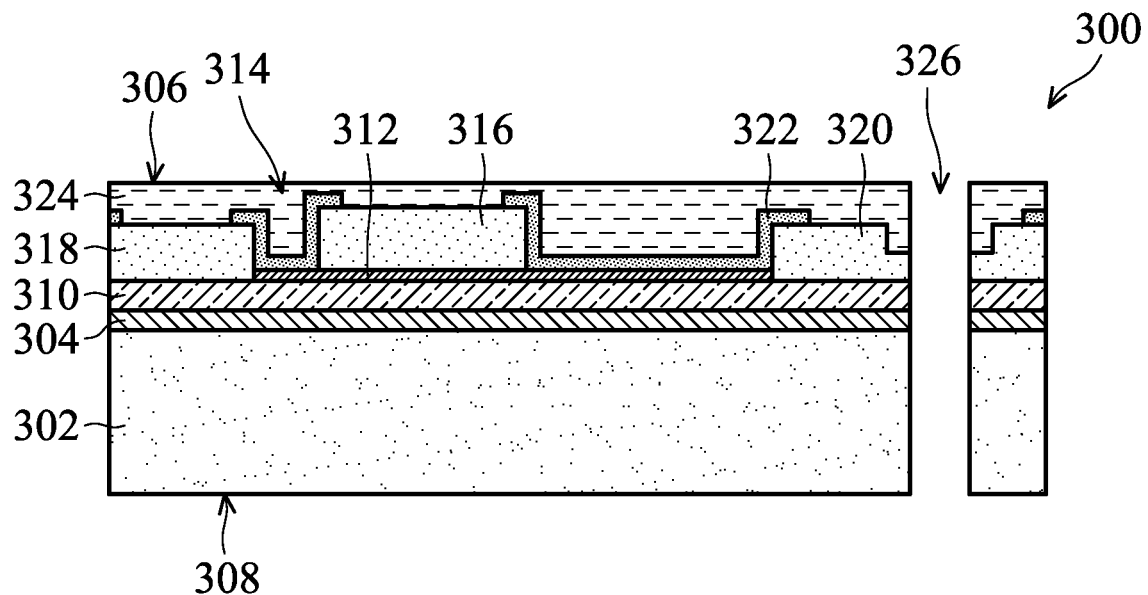

Next, referring to FIG. 3B, a photosensitive layer 324 is formed over the substrate 302 to protect the electronic device 314. Thereafter, referring to FIG. 3C, the photosensitive layer 324 is patterned by a lithography process and the substrate 302 is further etched using the patterned photosensitive layer 324 as a mask to form a via-hole 326 extending through the substrate 302 is formed. In an embodiment, the via-hole 326 can be formed by a laser beam.

Figure 3D:
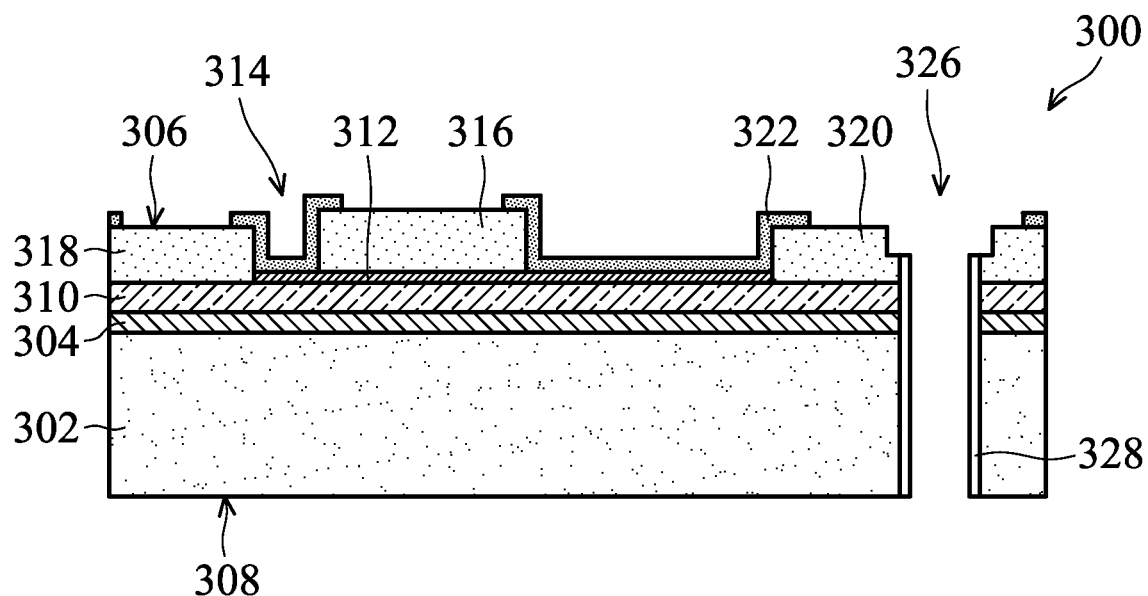

Referring to FIG. 3D, the photoresist layer 324 is then removed. In an embodiment, an insulating layer 328 is optionally formed on the sidewall of the via-hole 326 for protection. In an embodiment, the insulating layer 328 is silicon oxide and can be formed by thermal oxidation or liquid phase deposition (LPD).

Figure 3E:
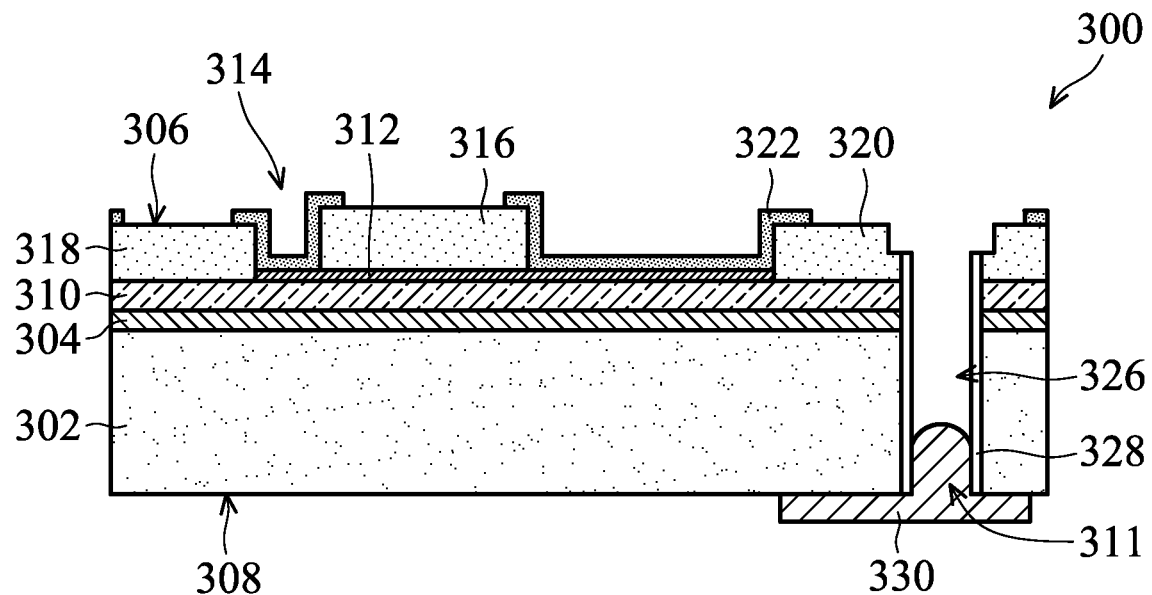
Figure 3F:
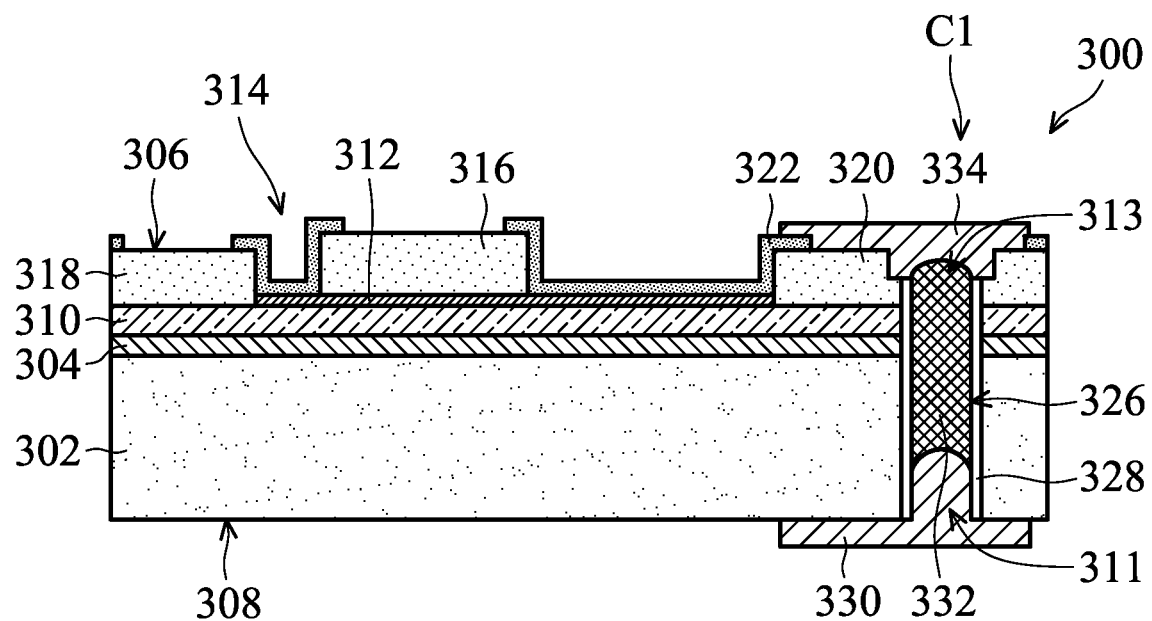

Referring to FIG. 3E, a first pad 330 is formed on the second side 308 of the substrate 302 and covers a second opening 311 of the via-hole 326. In an embodiment, the first pad 330 can comprise silver paste and can be formed by screen printing. Referring to FIG. 3F, an electroplating process is performed using the first pad 330 as a seed layer to form a via structure 332 which fills the via-hole 326. In an embodiment, the via structure 332 and the first pad 330 comprise the same material. In another embodiment, the via structure 332 and the first pad 330 comprise different materials. For example, the via structure 332 can comprise copper. As shown in FIG. 3F, since the via structure 332 is formed sequentially after forming the first pad 330, the via structure 332 does not exceed of the second opening 311 neighboring the second side 308 of the substrate 302, but can exceed a first opening 313 neighboring the first side 306 of the substrate 302. Next, a second pad 334, such as silver, is formed on the first side 306 of the substrate 302.

In FIG. 3F, the semiconductor device 300 includes the semiconductor substrate 302 and the electronic device 314. The semiconductor device 300 has the first side 306 and the second side 308 opposite to the first side 306. At least part of the electronic device 314 is adjacent to the first side 306. The semiconductor device 300 has the via-hole 326 formed through the semiconductor device 300, wherein the via-hole 326 has the first opening 313 adjacent to the first side 306 and the second opening 311 adjacent to the second side 308.

An interconnection structure C1 is disposed in the semiconductor device 300, wherein the interconnection structure C1 includes the via structure 332 and the first pad 330. The via structure 332 is disposed in the via-hole 326 without exceeding the first opening 311. The first pad 330 is disposed on the second side 308 of the semiconductor device 300 and covers the via-hole 326, wherein the first pad 330 is adjoined to the via structure 332 and is electrically connected to the electronic device 314.

The following description will illustrate embodiments of package structures adopting the semiconductor devices shown in FIGS. 1F, 2 and 3F.

Figure 4A:
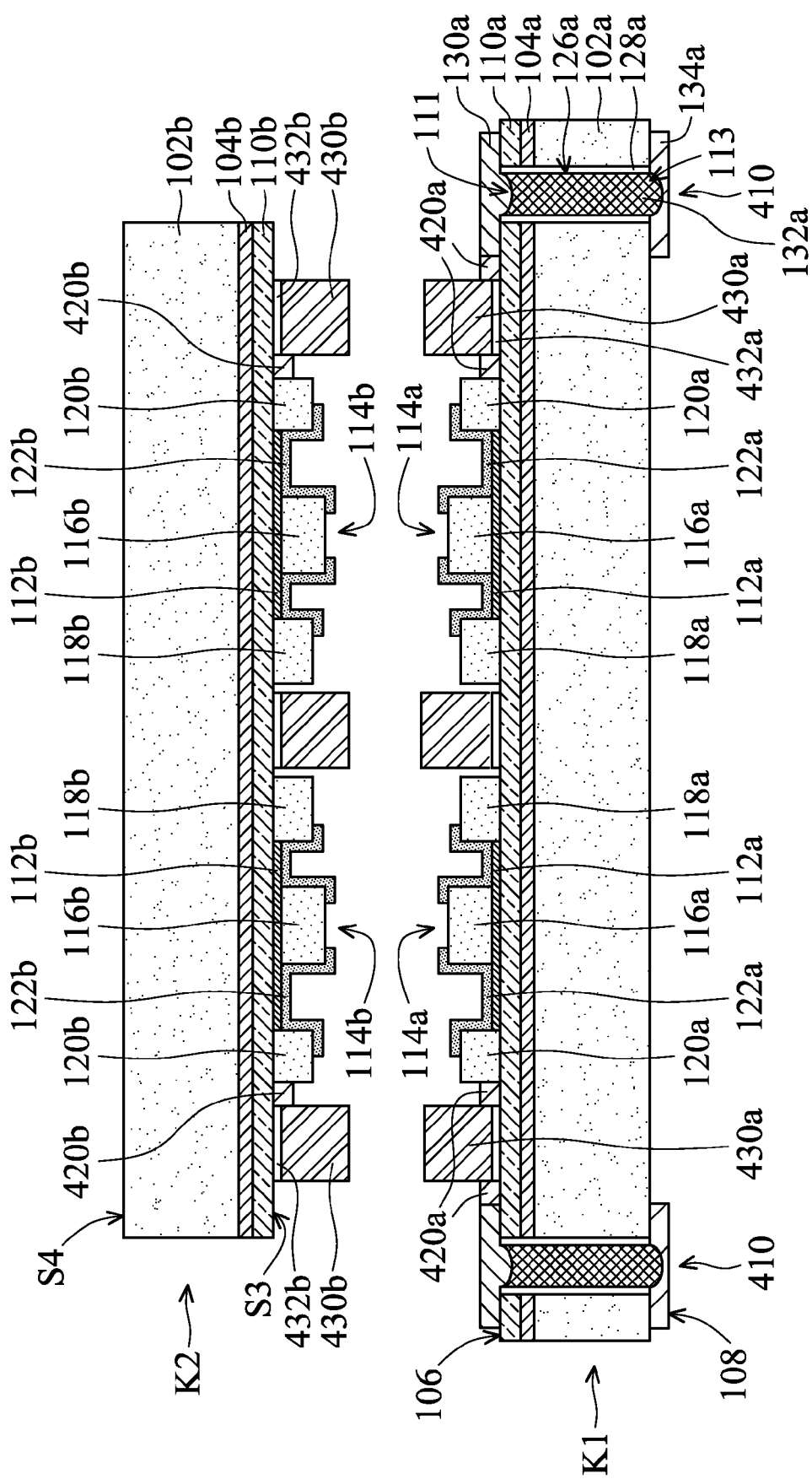
FIGS. 4A-4B show intermediate stages of cross sections of a method for forming a package structure of an embodiment of the invention.
Figure 4B:
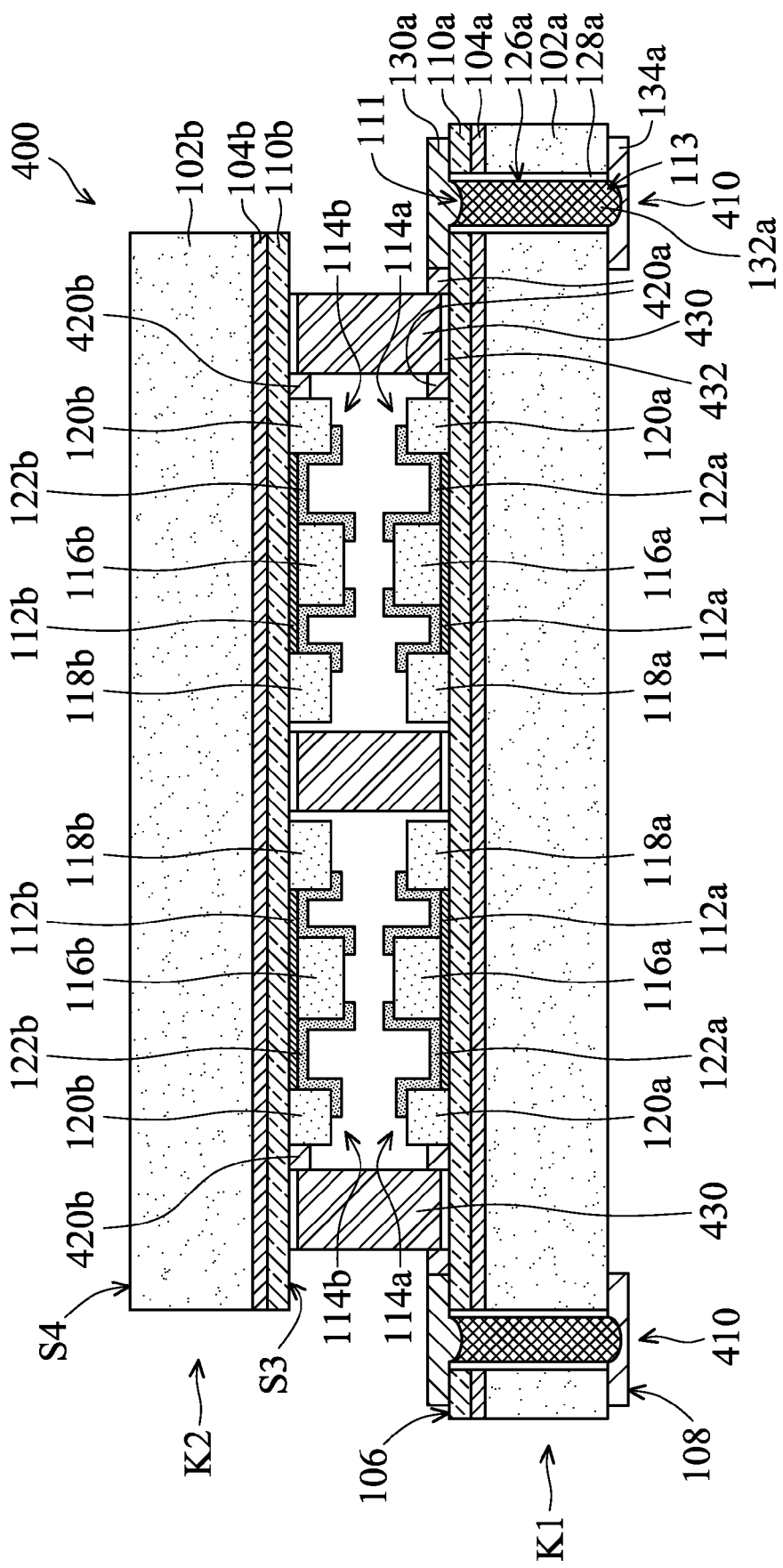

FIGS. 4A-4B show intermediate stages of cross sections of a method for forming a package structure of an embodiment of the invention.

It should be noted that, the elements in FIGS. 4A-4B, which are named and/or labeled identically to or similarly to those in FIGS. 1A-3F, have materials, structures and/or manufacturing methods that are similar thereto. Therefore, the detailed descriptions are not repeated herein.

Referring to FIG. 4A, a first semiconductor device K1 and a second semiconductor device K2 are provided. The first semiconductor device K1 has a first side 106 and a second side 108 opposite to the first side 106. The first semiconductor device K1 has a first semiconductor substrate 102a and a plurality of first electronic devices 114a. The first semiconductor substrate 102a is the same as the substrate 102 shown in FIG. 1A. In the present embodiment, the first semiconductor substrate 102a may be a die or a wafer.

The first electronic devices 114a are disposed on the first side 106. A plurality of via-holes 126a are formed through the first semiconductor substrate 102a, wherein each of the via-holes 126a has a first opening 111 adjacent to the first side 106 and a second opening 113 adjacent to the second side 108. The first electronic devices 114a may be a transistor and includes the channel layer 110a, the barrier layer 112a, the gate electrode 116a, the source electrode 118a, and the drain electrode 120a.

Interconnection structures 410 are disposed in the first semiconductor substrate 102a, wherein each of the interconnection structures 410 includes a via structure 132a and a first pad 130. Specifically, the via structure 132a is disposed in the via-hole 126a without exceeding the first opening 111, and the first pad 130a is disposed on the first side 106 of the first semiconductor substrate 102a and covers the via-hole 126a, wherein the first pad 130a is adjoined to the via structure 132a and is electrically connected to the first electronic device 114a. In one embodiment, a portion of the first pad 130a extends into the via-hole 126a. The interconnection structure 410 may further include a second pad 134a covering the second opening 113 and be adjoined with the via structure 132a.

Specifically, a redistribution layer 420a is formed on the first side 106 to electrically connect the first pad 130a and the first electronic device 114a. A plurality of bumps 430a may be formed on the first side 106 and may be electrically connected to the first pad 130a and the first electronic device 114a through the redistribution layer 420a. The bumps 430a include copper, solder or other suitable materials. An under bump metallurgy (UBM) layer 432a may be formed between the bumps 430a and the channel layer 110a. A passivation layer 122a, such as silicon nitride and silicon oxide, is formed to protect the first electronic device 114a thereunder.

The second semiconductor device K2 has a third side S3 and a fourth side 54 opposite to the third side S3, and the second semiconductor device K2 includes a second semiconductor substrate 102b (which is the same as the substrate 102 shown in FIG. 1A) and second electronic devices 114b disposed on the second semiconductor substrate 102b. The second electronic devices 114b are adjacent to the third side S3.

In the present embodiment, the second semiconductor substrate 102b may be a die. The second electronic devices 114b may be a transistor and includes the channel layer 110b, the barrier layer 112b, the gate electrode 116b, the source electrode 118b, and the drain electrode 120b.

Specifically, a plurality of bumps 430b may be formed on the third side S3. An under bump metallurgy (UBM) layer 432b may be formed between the bumps 430b and the channel layer 110b. A redistribution layer 420b is formed on the third side 53 to electrically connect the bumps 430b and the second electronic device 114b. A passivation layer 122b, such as silicon nitride and silicon oxide, is formed to protect the second electronic device 114b thereunder. The bumps 430b include copper, solder or other suitable materials.

Then, referring to FIG. 4B, the first semiconductor device K1 (or the first semiconductor substrate 102a) is substantially vertically integrated with the second semiconductor device K2 (or the second semiconductor substrate 102b) by connecting the bumps 430b and the bumps 430a to constitute a package structure 400. The connecting of the bumps 430b and the bumps 430a includes performing a reflow process. The bumps 430b and the bumps 430a are connected to form bumps 430.

The first electronic device 114a is electrically connected to the second electronic device 114b through the redistribution layer 420a, the bumps 430, and the redistribution layer 420b. The first electronic device 114a and the second electronic device 114b are both electrically connected to the interconnection structure 410.

In the present embodiment, the first side 106 of the first semiconductor substrate 102a and the third side S3 of the second semiconductor substrate 102b face each other. In other words, the first side 106 of the first semiconductor substrate 102a is adjacent to the third side S3 of the second semiconductor substrate 102b.

In FIG. 4B, the package structure 400 is formed, wherein the package structure 400 includes the first semiconductor device K1, the interconnection structure 410 and the second semiconductor device K2.

The first semiconductor device K1 includes the first semiconductor substrate 102a and the first electronic devices 114a. The first semiconductor device K1 has the first side 106 and the second side 108 opposite to the first side 106. The first electronic devices 114a are adjacent to the first side 106. The first semiconductor device K1 has the via-holes 126a formed through the first semiconductor device K1, wherein each of the via-holes 126a has the first opening 111 adjacent to the first side 106.

The interconnection structure 410 is disposed in the first semiconductor device K1, wherein the interconnection structure 410 includes the via structure 132a and the first pad 130a. The via structure 132a is disposed in the via-hole 126a without exceeding the first opening 111. The first pad 130a is disposed on the first side 106 of the first semiconductor device K1 and covers the via-hole 126a, wherein the first pad 130a is adjoined to the via structure 132a and is electrically connected to the electronic device 114a.

The second semiconductor device K2 is vertically integrated with the first semiconductor device K1, wherein the second semiconductor device K2 includes the second electronic device 114b electrically connected with the first electronic device 114a.

It should be noted that the present embodiment adopts the interconnection structure 410 to replace conventional wires (not shown), and the interconnection structure 410 has an electrical performance better than that of conventional wires, which benefits the performance of the package structure 400.

Figure 5:
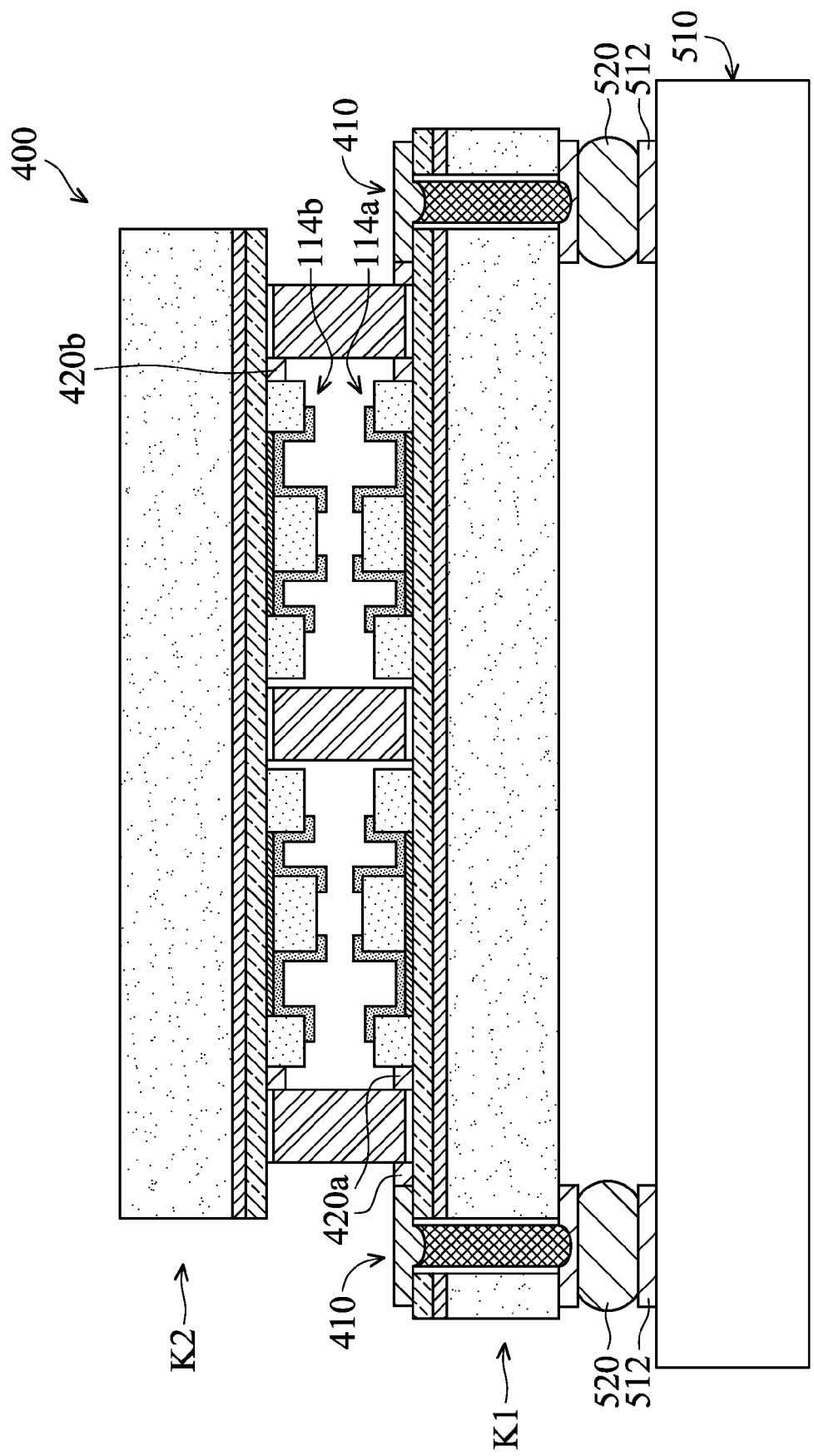
FIG. 5 shows an intermediate stage of a cross section of a method for forming a package structure of an embodiment of the invention.

FIG. 5 shows an intermediate stage of cross section of a method for forming a package structure of an embodiment of the invention. Referring to FIG. 5, a carrier substrate 510 is provided, wherein the carrier substrate 510 may be a printed circuit board, a wafer, or a die. The carrier substrate 510 has a plurality of pads 512 thereon. Then, the package structure 400 in FIG. 4B may be substantially vertically integrated with the carrier substrate 510 through bumps 520 therebetween. The first electronic device 114a and the second electronic device 114b are both electrically connected to the pads 512 of the carrier substrate 510 through the interconnection structures 410.

Figure 6:
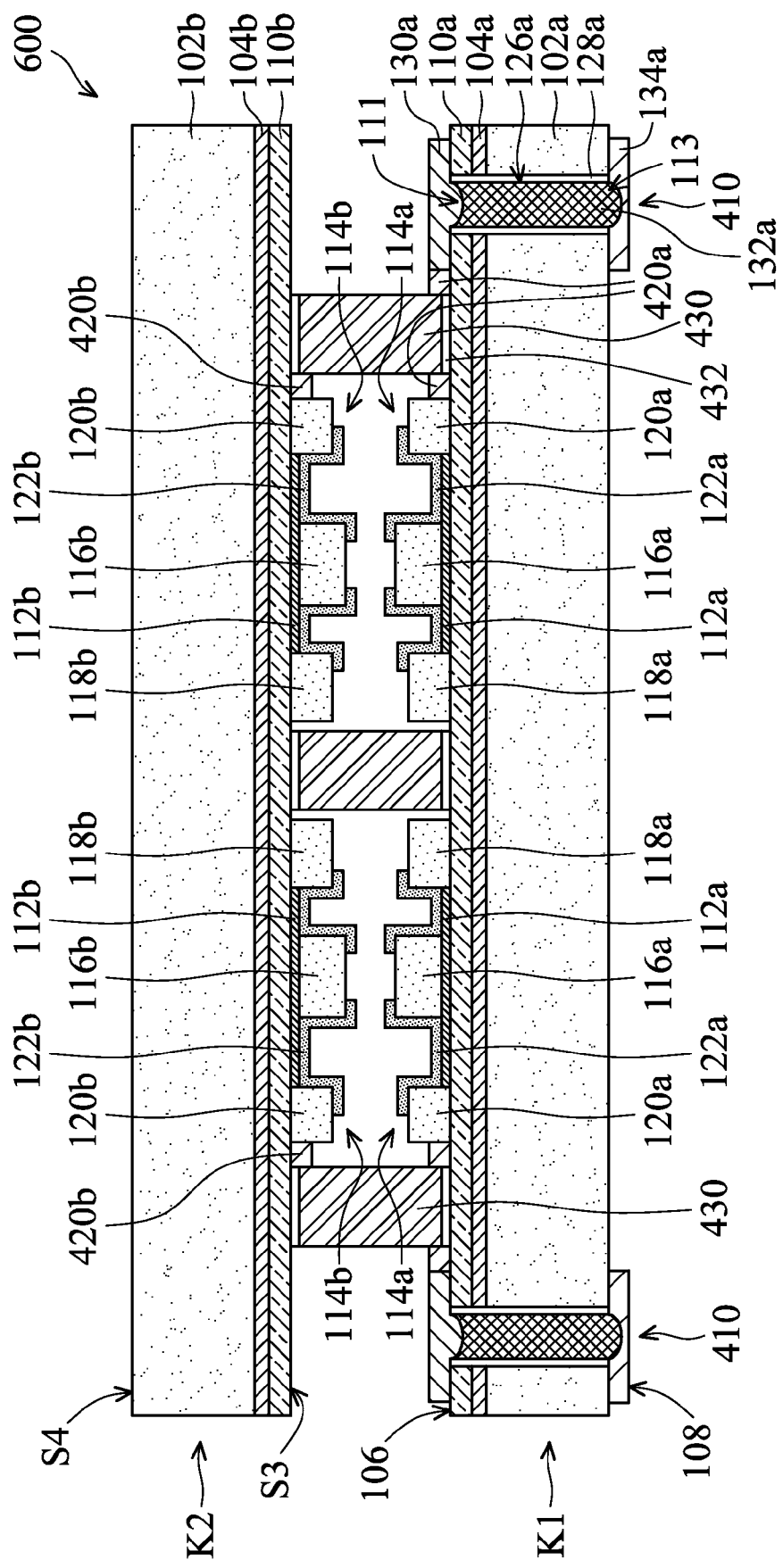
FIG. 6 is a cross-sectional view of a package structure according to an embodiment of the present invention.

FIG. 6 is a cross-sectional view of a package structure according to an embodiment of the present invention. Referring to FIG. 6, a package structure 600 of the present embodiment is similar to the package structure 400 shown in FIG. 4B, except that the second semiconductor substrate 102b of the package structure 600 is a wafer. Specifically, the first semiconductor substrate 102a and the second semiconductor substrate 102b are both wafers.

Figure 7A:
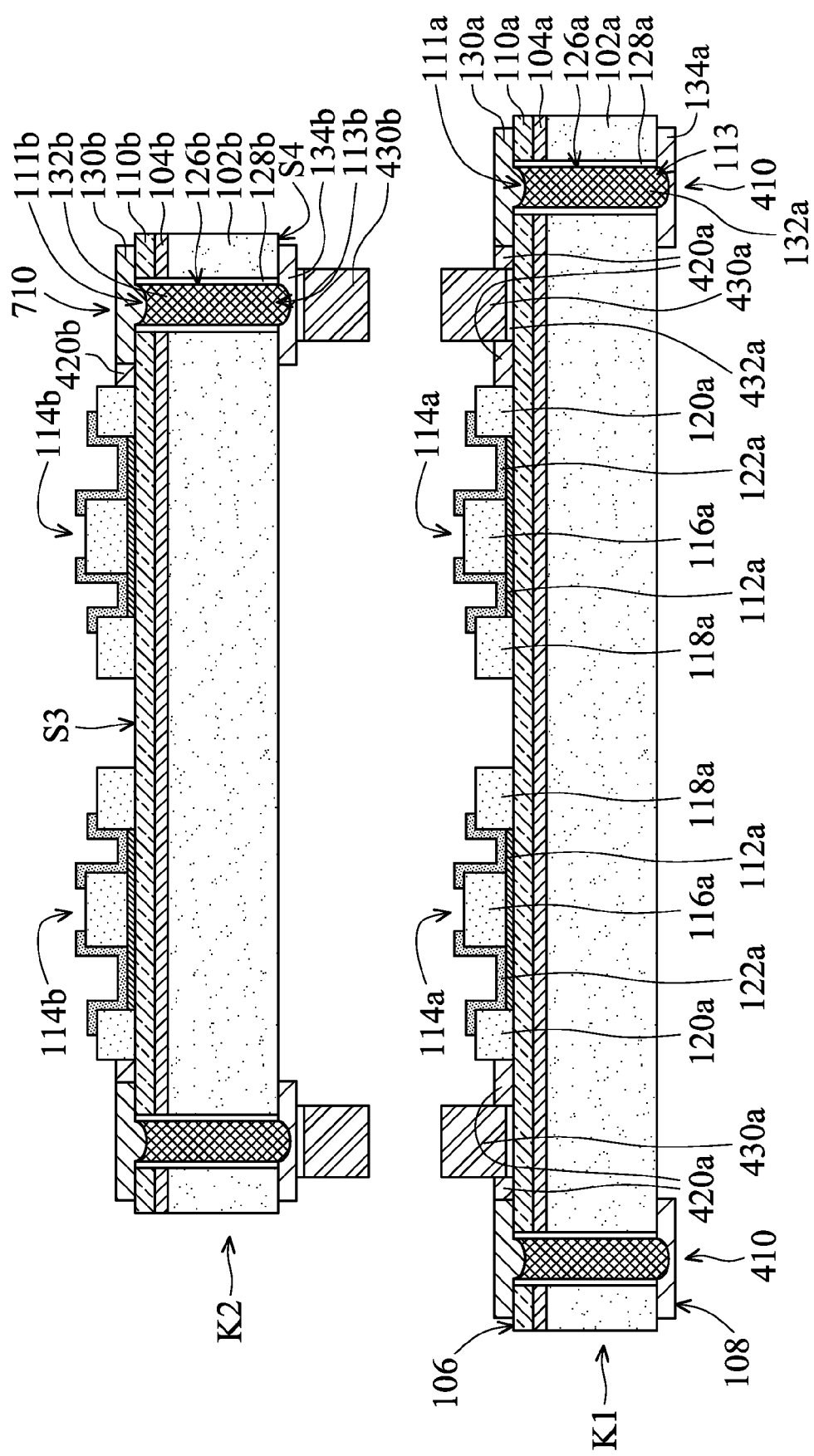
FIGS. 7A-7B show intermediate stages of cross sections of a method for forming a package structure of an embodiment of the invention.
Figure 7B:
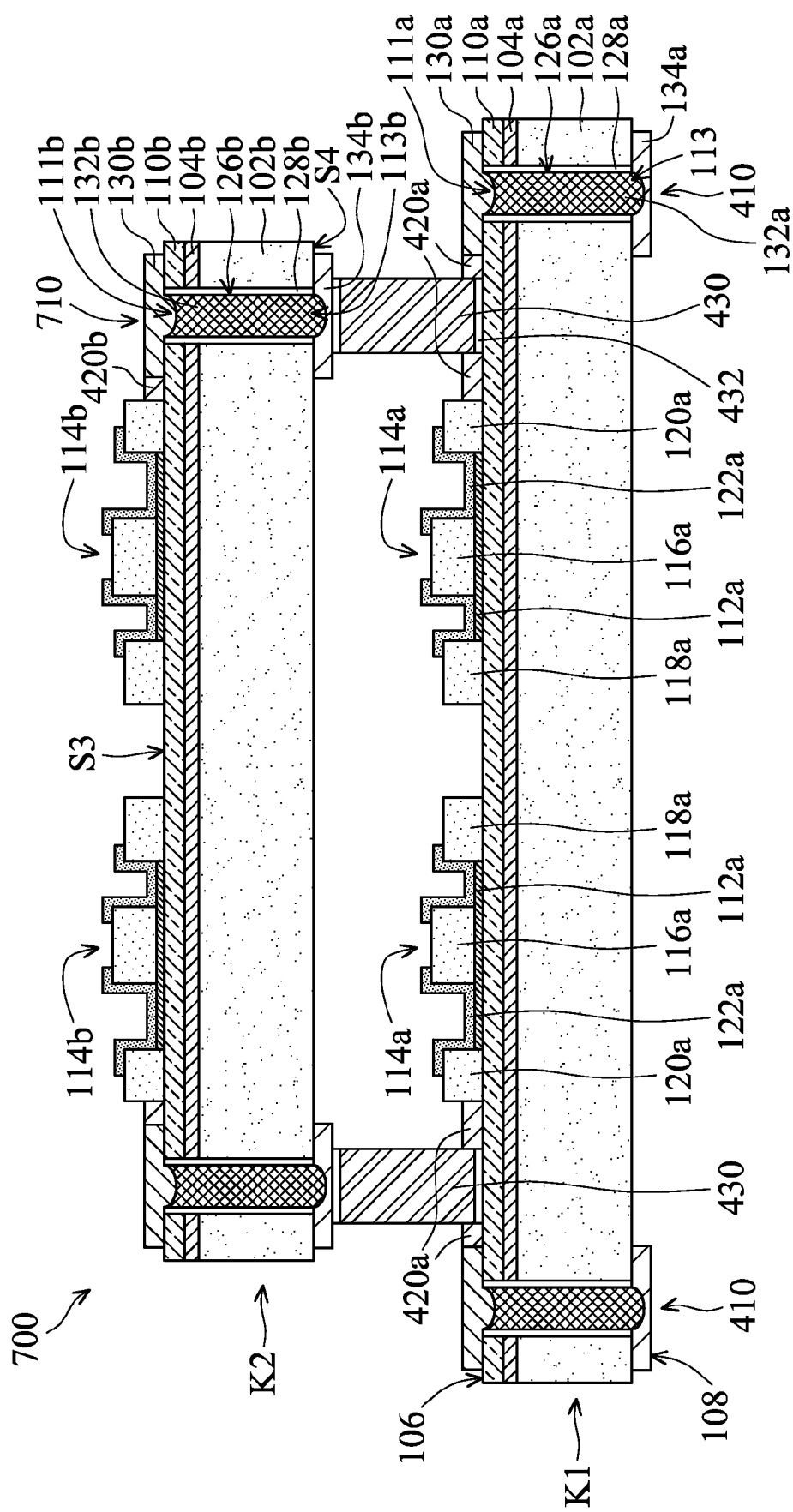

FIGS. 7A-7B show intermediate stages of cross sections of a method for forming a package structure of an embodiment of the invention.

It should be noted that the elements in FIGS. 7A-7B, which are named and/or labeled identically to or similarly to those in FIGS. 1A-6, have materials, structures and/or manufacturing methods that are similar thereto. Therefore, the detailed descriptions are not repeated herein.

It should be noted that the method shown in FIGS. 7A-7B is similar to the method shown in FIGS. 4A-4B, except that the second semiconductor device K2 (or the second semiconductor substrate 102b) in FIGS. 7A-7B is reversed compared to the second semiconductor device K2 (or the second semiconductor substrate 102b) in FIGS. 4A-4B. Specifically, the third side S3 of the second semiconductor device K2 disposed with the second electronic devices 114b faces away from the first semiconductor device K1, and the fourth side 54 of the second semiconductor device K2 faces the first semiconductor device K1.

Referring to FIG. 7A, the first semiconductor device K1 having the first semiconductor substrate 102a and the second semiconductor device K2 having the second semiconductor substrate 102b are provided. In the present embodiment, the first semiconductor substrate 102a may be a die or a wafer. Interconnection structures 710 are disposed in the second semiconductor device K2, wherein each of the interconnection structures 710 includes a via structure 132b and a first pad 130b.

Specifically, the via structure 132b is disposed in the via-hole 126b without exceeding the first opening 111b, and the first pad 130b is disposed on the third side 53 of the second semiconductor substrate 102b and covers the via-hole 126b, wherein the first pad 130b is adjoined to the via structure 132b and is electrically connected to the second electronic device 114b through the redistribution layer 420b. In one embodiment, a portion of the first pad 130b extends into the via-hole 126b. The interconnection structure 710 may further include a second pad 134b covering the second opening 113b and be adjoined with the via structure 132b. The bumps 430b are disposed on and electrically connected to the second pads 134b.

Then, referring to FIG. 7B, the first semiconductor device K1 is substantially vertically integrated with the second semiconductor device K2 by connecting the bumps 430b and the bumps 430a to constitute a package structure 700. The bumps 430b and the bumps 430a are connected to form bumps 430.

The first electronic device 114a is electrically connected to the second electronic device 114b through the redistribution layer 420a, the bumps 430, the interconnection structure 710, and the redistribution layer 420b. The first electronic device 114a and the second electronic device 114b are both electrically connected to the interconnection structures 410 and 710.

In the present embodiment, the first side 106 of the first semiconductor device K1 and the fourth side S4 of the second semiconductor device K2 face each other. In other words, the first side 106 of the first semiconductor device K1 is adjacent to the fourth side S4 of the second semiconductor device K2.

Figure 8:
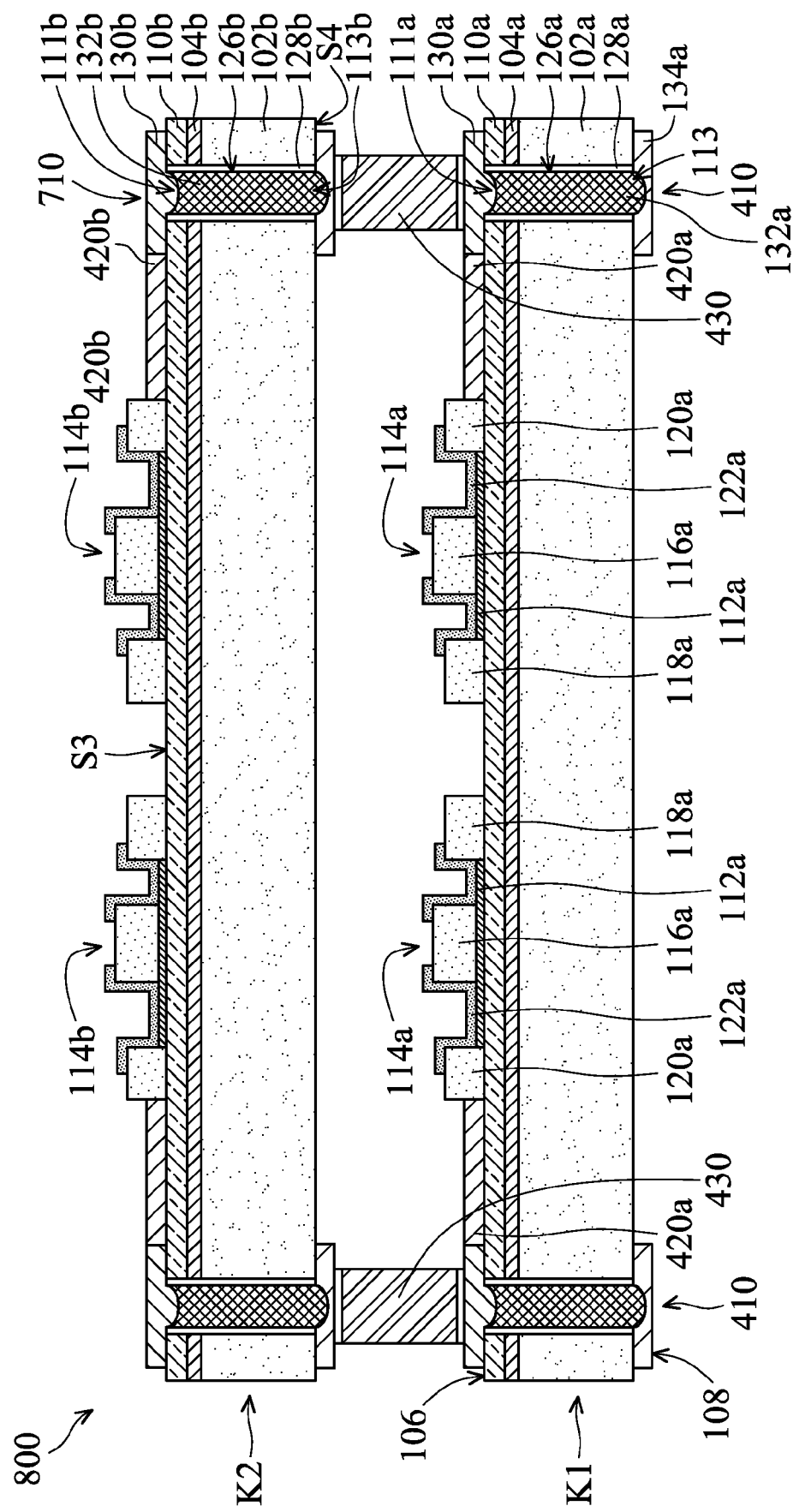
FIG. 8 is a cross-sectional view of a package structure according to an embodiment of the present invention.

FIG. 8 is a cross-sectional view of a package structure according to an embodiment of the present invention. Referring to FIG. 8, a package structure 800 of the present embodiment is similar to the package structure 700 shown in FIG. 7B, except that the second semiconductor substrate 102b of the package structure 800 is a wafer. Specifically, the first semiconductor substrate 102a and the second semiconductor substrate 102b of the package structure 800 are both wafers. Furthermore, the interconnection structures 410 and 710 may be aligned with each other, and the bumps 430 may be sandwiched between and connected to the interconnection structures 410 and 710.

Figure 9A:
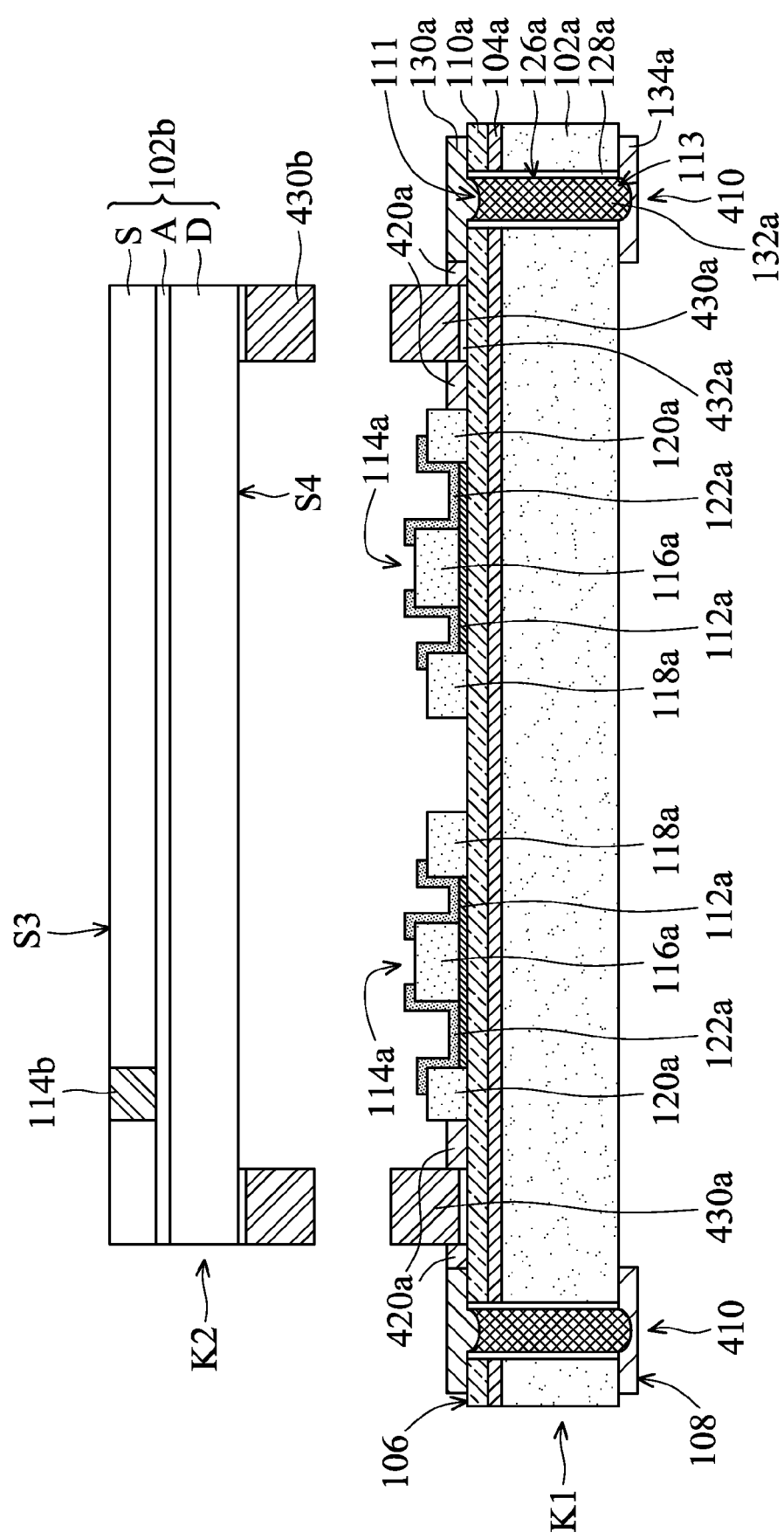
FIGS. 9A-9B show intermediate stages of cross sections of a method for forming a package structure of an embodiment of the invention.
Figure 9B:
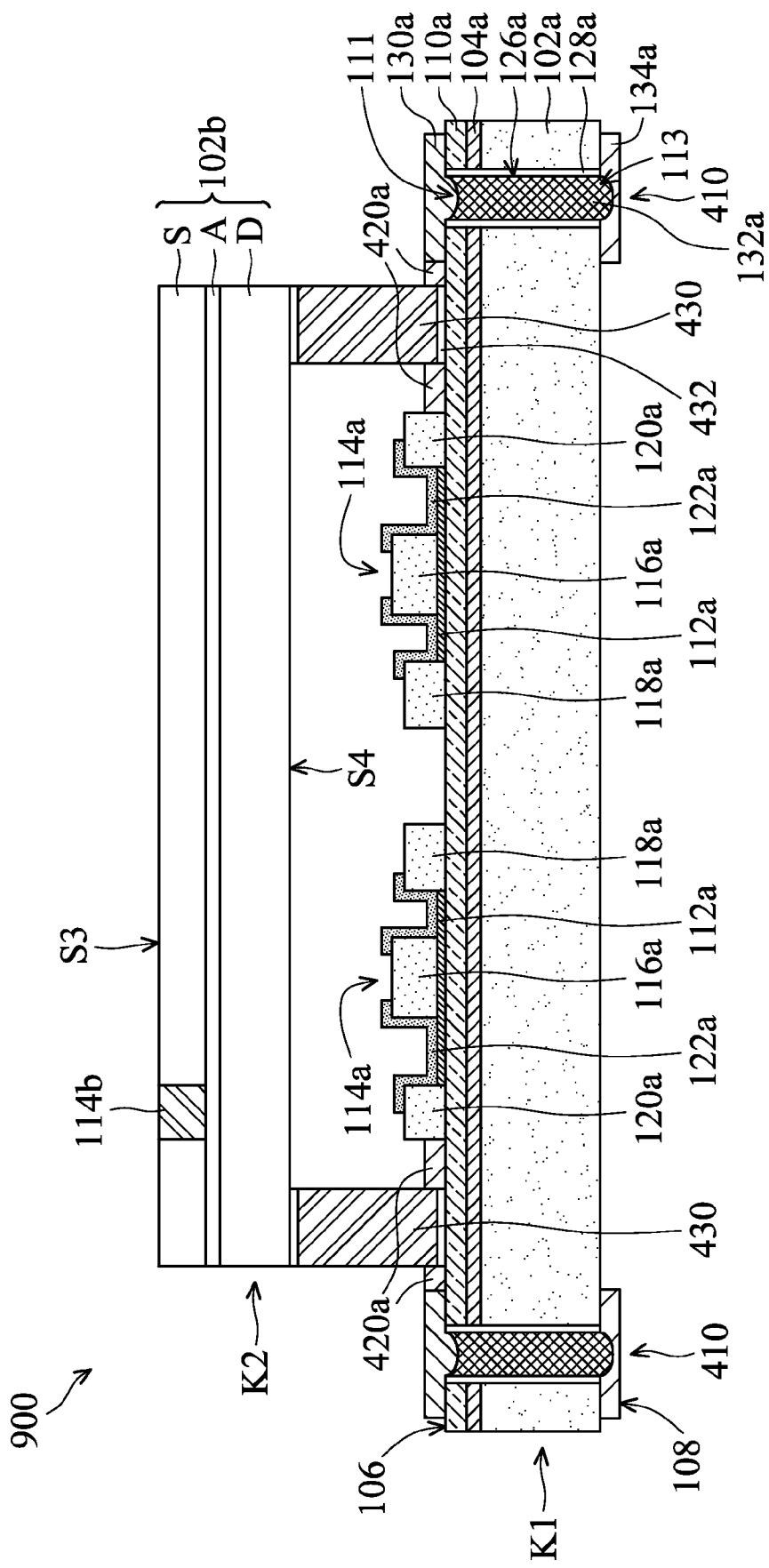

FIGS. 9A-9B show intermediate stages of cross sections of a method for forming a package structure of an embodiment of the invention.

It should be noted that the elements in FIGS. 9A-9B, which are named and/or labeled identically to or similarly to those in FIGS. 1A-8, have materials, structures and/or manufacturing methods that are similar thereto. Therefore, the detailed descriptions are not repeated herein.

It should be noted that the method shown in FIGS. 9A-9B is similar to the method shown in FIGS. 7A-7B, except that the second semiconductor device K2 in FIGS. 9A-9B includes a source electrode layer S, a drain electrode layer D, and an active layer A sandwiched therebetween. Besides, the second electronic device 114b of the second semiconductor device K2 adjacent to the third side S3 is a gate electrode.

Specifically, the second electronic device 114b (i.e. the gate electrode) passes through the source electrode layer S, wherein an insulating layer (not shown) is disposed between the second electronic device 114b and the source electrode layer S and between the second electronic device 114b and the active layer A to electrically insulate the second electronic device 114b from the source electrode layer S and the active layer A.

Referring to FIG. 9A, the first semiconductor device K1 having the first semiconductor substrate 102a and the second semiconductor device K2 having the second semiconductor substrate 102b are provided. In the present embodiment, the first semiconductor substrate 102a may be a die or a wafer, and the second semiconductor substrate 102b may be a die. The bumps 430b are disposed on the fourth side 54 of the second semiconductor device K2 and are electrically connected to the drain electrode layer D.

Then, referring to FIG. 9B, the first semiconductor device K1 is substantially vertically integrated with the second semiconductor device K2 by connecting the bumps 430b and the bumps 430a to constitute a package structure 900. The bumps 430b and the bumps 430a are connected to form bumps 430.

The first electronic device 114a is electrically connected to the second semiconductor device K2 through the redistribution layer 420a and the bumps 430. The first electronic device 114a and the second semiconductor device K2 are both electrically connected to the interconnection structure 410.

In the present embodiment, the first side 106 of the first semiconductor device K1 and the fourth side S4 of the second semiconductor device K2 face each other. In other words, the first side 106 of the first semiconductor device K1 is adjacent to the fourth side S4 of the second semiconductor device K2.

Figure 10A:
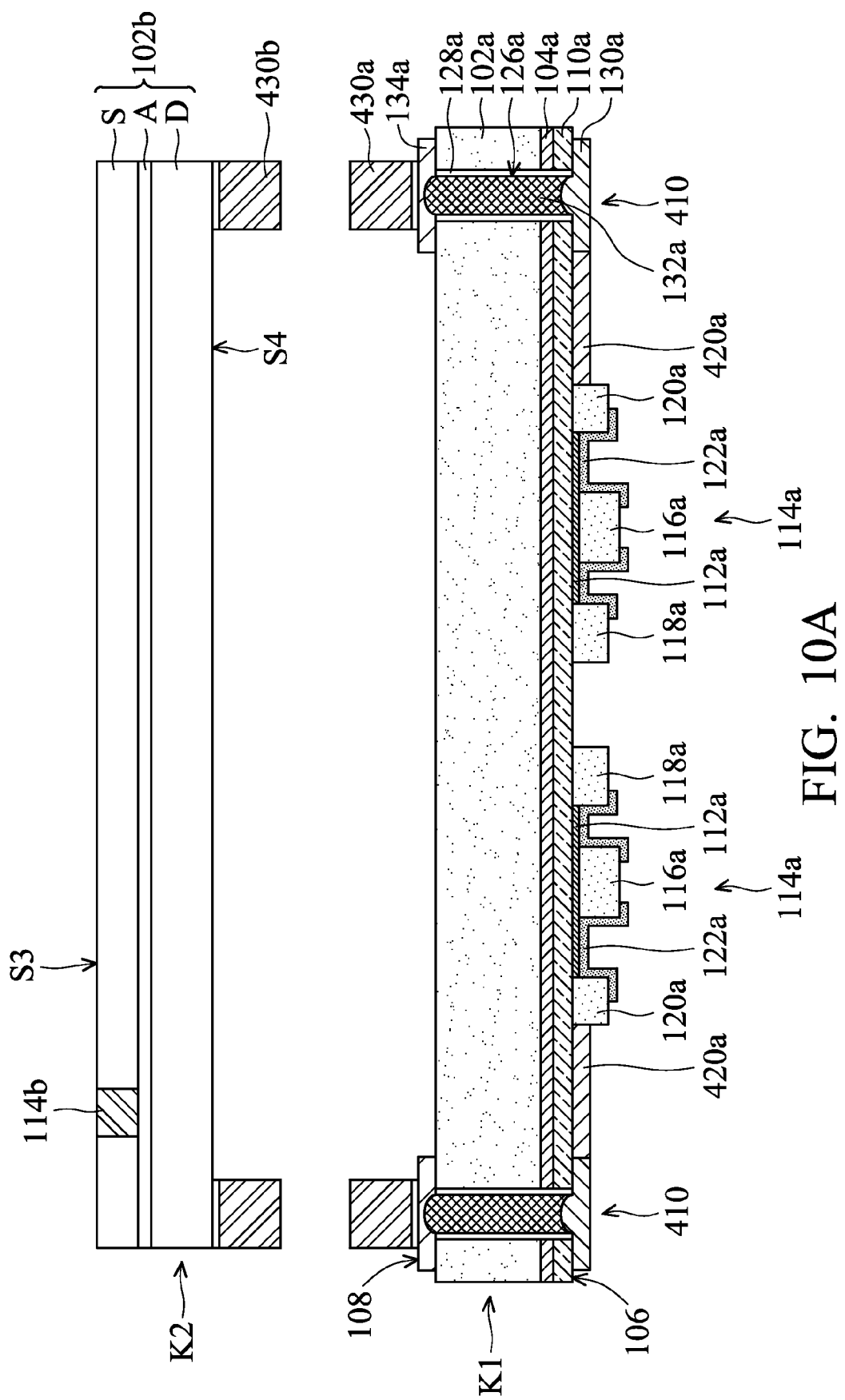
FIGS. 10A-10B show intermediate stages of cross sections of a method for forming a package structure of an embodiment of the invention.
Figure 10B:
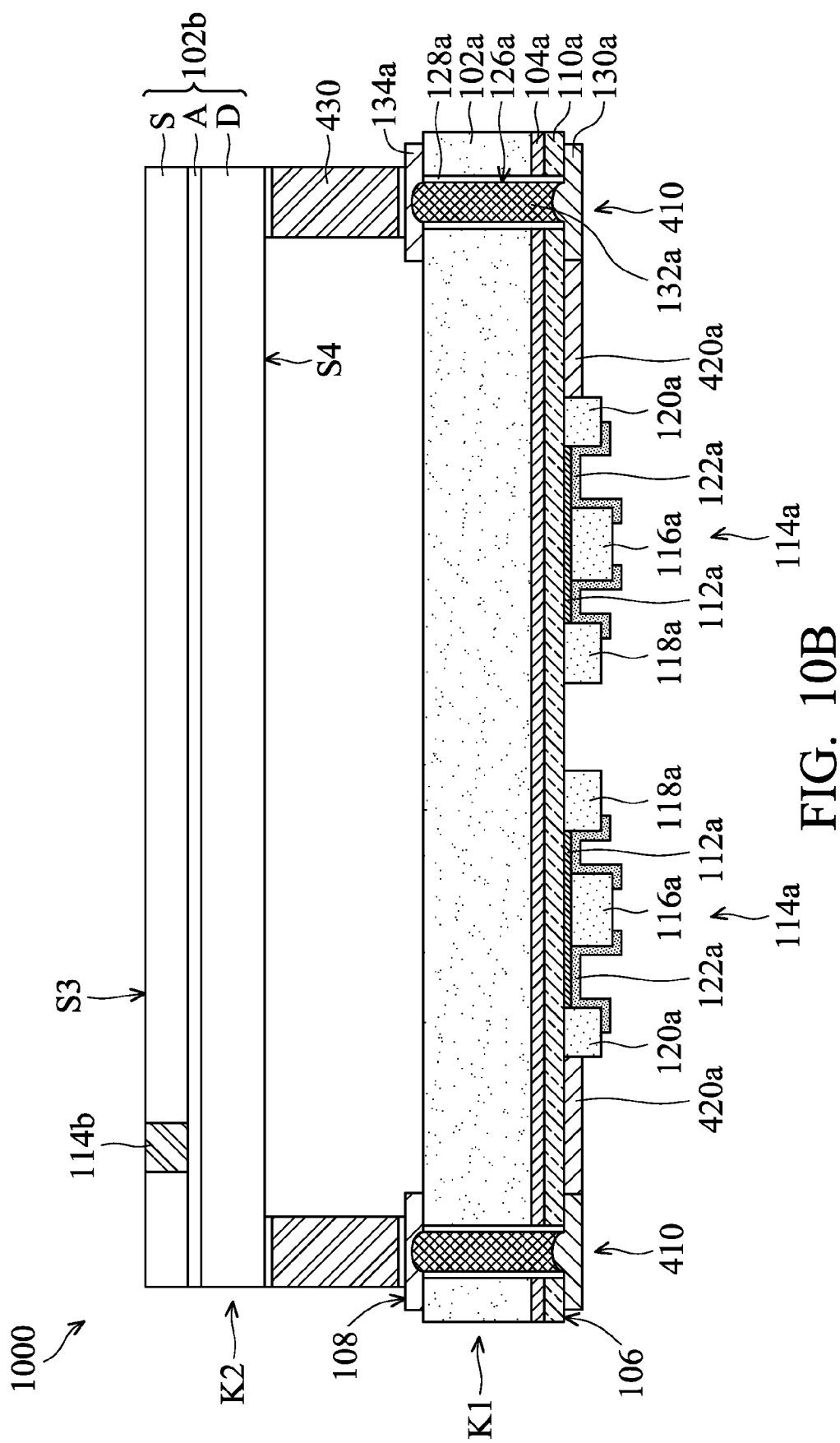

FIGS. 10A-10B show intermediate stages of cross sections of a method for forming a package structure of an embodiment of the invention.

It should be noted that the elements in FIGS. 10A-10B, which are named and/or labeled identically to or similarly to those in FIGS. 1A-9B, have materials, structures and/or manufacturing methods that are similar thereto. Therefore, the detailed descriptions are not repeated herein.

It should be noted that the method shown in FIGS. 10A-10B is similar to the method shown in FIGS. 9A-9B, except that the first semiconductor device K1 in FIGS. 10A-10B is reversed compared to the first semiconductor device K1 in FIGS. 9A-9B. Specifically, the first side 106 of the first semiconductor device K1 disposed with the first electronic devices 114a faces away from the second semiconductor device K2, and the second side 108 of the first semiconductor device K1 faces the second semiconductor device K2.

Referring to FIG. 10A, the first semiconductor device K1 having the first semiconductor substrate 102a and the second semiconductor device K2 having the second semiconductor substrate 102b are provided. In the present embodiment, the first semiconductor substrate 102a may be a die or a wafer, and the second semiconductor substrate 102b may be a die. The bumps 430a are disposed on and electrically connected to the second pads 134a.

Then, referring to FIG. 10B, the first semiconductor device K1 is substantially vertically integrated with the second semiconductor device K2 by connecting the bumps 430b and the bumps 430a to constitute a package structure 1000. The bumps 430b and the bumps 430a are connected to form bumps 430.

The first electronic device 114a is electrically connected to the second semiconductor device K2 through the redistribution layer 420a, the interconnection structure 410, and the bumps 430. The first electronic device 114a and the second semiconductor device K2 are both electrically connected to the interconnection structure 410.

In the present embodiment, the second side 108 of the first semiconductor device K1 and the fourth side S4 of the second semiconductor device K2 face each other. In other words, the second side 108 of the first semiconductor device K1 is adjacent to the fourth side S4 of the second semiconductor device K2.

It should be noted that, in the above embodiments, the first electronic device 114a and the first pad 130a are both formed on the same side (i.e. the first side) as an exemplary example for illustration, and should not be adopted for limiting the present invention. In other embodiments (such as the embodiment of FIG. 3F), the first electronic device 314 and the first pad 330 may be formed on different sides. For example, the first electronic device 314 and the first pad 330 may be formed on the side 306 and the side 308, respectively. Besides, the passivation layer 322 may be formed on the side 306 to protect the first electronic device 314 thereunder.

Figure 11A:
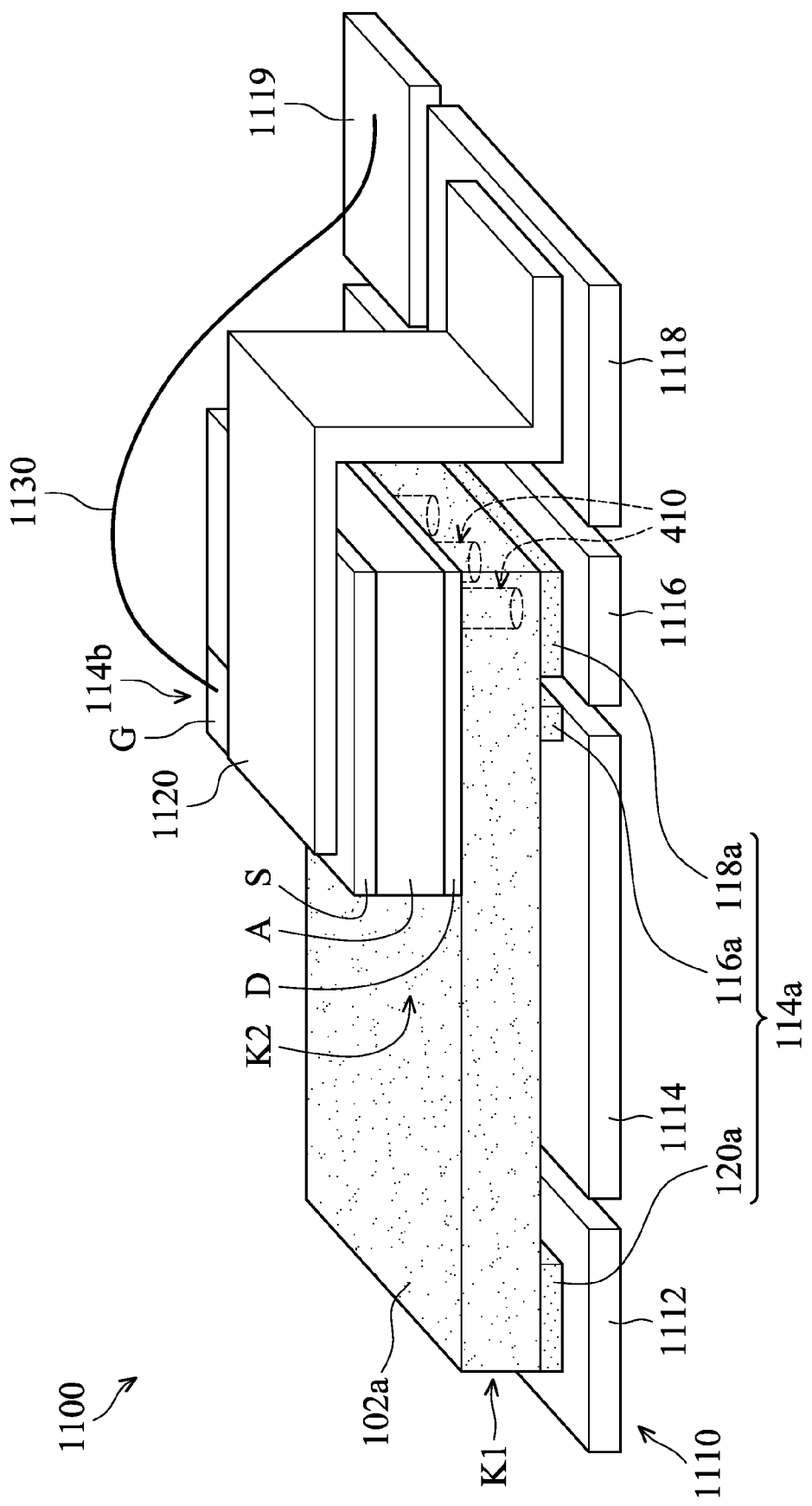
FIG. 11A is a perspective drawing of a package structure according to an embodiment of the present invention.
Figure 11B:
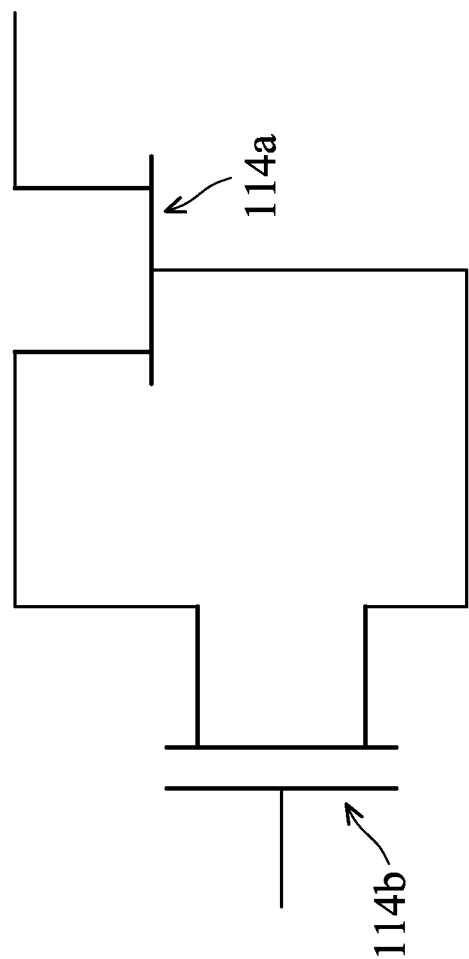
FIG. 11B is an equivalent-circuit diagram of the package structure shown in FIG. 11A.

FIG. 11A is a perspective drawing of a package structure according to an embodiment of the present invention. FIG. 11B is an equivalent-circuit diagram of the package structure shown in FIG. 11A.

It should be noted that the package structure 1100 shown in FIG. 11A is similar to the package structure 1000 shown in FIG. 10B, except that the package structure 1100 shown in FIG. 11A further includes a lead frame 1110.

Specifically, as shown in FIGS. 11A and 11B, the first semiconductor device K1 includes a HEMT device made of nitride-based semiconductor material and the second semiconductor device K2 includes a vertical transistor made of silicon-based material. The first and the second semiconductor devices K1 and K2 are stacked on the lead frame 1110.

The lead frame 1110 has many portions 1112, 1114, 1116, 1118 and 1119 separated from each other. The first semiconductor device K1 is disposed on the lead frame 1110 and has a first semiconductor substrate 102a and a first electronic device 114a. In this embodiment, the first electronic device 114a is a HEMT device disposed on an active region of the first semiconductor device K1. The first semiconductor device K1 further includes a passivation layer covering parts of the active region, the gate electrode 116a, the source electrode 118a, and the drain electrode 120a. The drain electrode 120a is disposed on and electrically connected to the portion 1112. The gate electrode 116a are disposed on and electrically connected to the portion 1114. The source electrode 118a is disposed on and electrically connected to the portion 1116. The portion 1112 or the portion 1114 can optionally cover parts of the passivation layer to enhance the field plate effect according to a requirement of product design.

Interconnection structures 410 are disposed in the first semiconductor substrate 102a. The second semiconductor device K2 is disposed on the first semiconductor device K1. The second semiconductor device K2 comprises a second electronic device 114b. In this embodiment, the second electronic device 114b is a vertical transistor including a source electrode S, a gate electrode G, and a drain electrode D, wherein the drain electrode D of the second electronic device 114b is electrically connected to the source electrode 118a of the first electronic device 114a through the interconnection structures 410. The source electrode S is electrically connected to the portion 1118 through a clip structure (e.g. a metal sheet) 1120 connected therebetween. Specifically, the source electrode S of the second electronic device 114b is electrically connected to the gate electrode 116a of the first electronic devices 114a through the clip structure 1120 and a conductive path (not shown) inside the lead frame 1110. The gate electrode 114b is electrically connected to the portion 1119 through a bonding wire 1130 connected therebetween.

In view of the foregoing, the invention adopts the interconnection structure to replace conventional wires, and the interconnection structure has a better electrical performance than that of conventional wires, which benefits the performance of the package structure. Besides, the method for forming the interconnection structure of the invention forms the via structure using electroplating with the first pad as a seed layer, and no vacuum environment is required for forming the interconnect structure. Therefore, the method of the invention can produce semiconductor devices at a lower cost.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a package structure comprising:
providing a first semiconductor device having a first side and a second side opposite to to the first side;
forming a via-hole through the first semiconductor device, wherein the via-hole has a first opening neighboring the first side and a second opening neighboring the second side;
forming a first pad covering the first opening;
forming a via structure in the via-hole subsequent to forming the first pad, wherein the via structure comprises a conductive material and is adjoined to the first pad; and
substantially vertically integrating the first semiconductor device with a second semiconductor device.

2. The method of forming the package structure as claimed in claim 1, further comprising:
forming a second pad covering the second opening and adjoined with the via structure.

3. The method of forming the package structure as claimed in claim 1, wherein the first semiconductor device comprising:
a first semiconductor substrate;
a first electronic device disposed on the first semiconductor substrate, at least part of the first electronic device being adjacent to the first side of the first semiconductor device; and
a passivation layer disposed on the first semiconductor substrate and the first electronic device.

4. The method of forming the package structure as claimed in claim 3, wherein the second semiconductor device has a third side and a fourth side opposite to the third side, and the second semiconductor device comprises a second semiconductor substrate and a second electronic device disposed on the second semiconductor substrate, at least part of the second electronic device being adjacent to the third side.

5. The method of forming the package structure as claimed in claim 4, wherein the first semiconductor device is vertically integrated with the second semiconductor device while the first side of the first semiconductor device and the third side of the second semiconductor device face each other.

6. The method of forming the package structure as claimed in claim 4, wherein the first semiconductor device is vertically integrated with the second semiconductor device while the second side of the first semiconductor device and the third side of the second semiconductor device face each other.

7. The method of forming the package structure as claimed in claim 4, wherein the first semiconductor device is vertically integrated with the second semiconductor device while the second side of the first semiconductor device and the fourth side of the second semiconductor device face each other.

8. The method of forming the package structure as claimed in claim 4, wherein the first semiconductor device is vertically integrated with the second semiconductor device while the first side of the first semiconductor device and the fourth side of the second semiconductor device face each other.

9. The method of forming the package structure as claimed in claim 1, wherein the forming of the first pad comprises performing a screen printing process to form the first pad covering the first opening.

10. The method of forming the package structure as claimed in claim 1, wherein the first semiconductor device comprising:
a first semiconductor substrate;
a first electronic device disposed on the first semiconductor substrate and at least part of the first electronic device being adjacent to the second side of the first semiconductor device; and
a passivation layer disposed on the first semiconductor substrate and thefirst electronic device.

* * * * *